(12) United States Patent
Im et al.

(10) Patent No.: US 8,163,203 B2
(45) Date of Patent: Apr. 24, 2012

(54) YELLOW EMITTING PHOSPHORS BASED ON CE³⁺-DOPED ALUMINATE AND VIA SOLID SOLUTION FOR SOLID-STATE LIGHTING APPLICATIONS

(75) Inventors: Won-bin Im, Goleta, CA (US); Ram Seshadri, Goleta, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 470 days.

(21) Appl. No.: 12/394,492

(22) Filed: Feb. 27, 2009

(65) Prior Publication Data

US 2009/0212314 A1 Aug. 27, 2009

Related U.S. Application Data

(60) Provisional application No. 61/067,297, filed on Feb. 27, 2008, provisional application No. 61/074,281, filed on Jun. 20, 2008.

(51) Int. Cl.
*C09K 11/80* (2006.01)
*H01L 33/00* (2010.01)

(52) U.S. Cl. .......... 252/301.4 R; 252/301.4 F; 313/503; 313/486; 257/98

(58) Field of Classification Search ............ 252/301.4 R, 252/301.4 F; 313/503, 486; 257/98
See application file for complete search history.

(56) References Cited

U.S. PATENT DOCUMENTS

| 6,538,371 B1 | 3/2003 | Duggal et al. |
| 7,045,826 B2 | 5/2006 | Kim et al. |
| 7,081,345 B1 | 7/2006 | Roecklin et al. |
| 7,332,106 B2 | 2/2008 | Yoshino et al. |
| 2005/0212397 A1 | 9/2005 | Murazaki et al. |
| 2007/0241666 A1 | 10/2007 | Jang et al. |

FOREIGN PATENT DOCUMENTS

| WO | 98/05078 | 2/1998 |
| WO | 2006/081803 | 8/2006 |
| WO | 2007/018345 | 2/2007 |

OTHER PUBLICATIONS

Blasse et al., "Fluorescence of Eu2-activated silicates," Philps. Res. Repts. 23, 1968, pp. 189-200.
Drofenik et al., "Refinement of the Sr2EuFeO5 and SrEuAlO5 structures," Acta Cryst., B35, 1979, pp. 1059-1062.
Glasser et al., "Silicates M3SiO5I. Sr3SiO5," Acta Cryst., 18, 1965, pp. 453-454.
Greenham, "Measurement of absolute photoluminescence quantum efficiencies in conjugated polymers," Chemical Physics Letters, 241, Jul. 14, 1995, pp. 89-96.
Im et al., "A yellow-emitting Ce3+ phosphor, La1-xCexSr2AlO5, for white-emitting diodes," Applied Physics Letters, 93, 2008, pp. 091905-1-091905-3.
Im et al. "La1-x-0.025Ce0.025Sr2+xAl1-xSixO5 solid solutions as tunable yellow phosphors for solid state white lighting," J. Mater. Chem, 19, 2009, pp. 1325-1330.

(Continued)

*Primary Examiner* — Carol M Koslow
(74) *Attorney, Agent, or Firm* — Gates & Cooper LLP

(57) ABSTRACT

A Ce³⁺ based aluminate phosphor or Ce³⁺ based phosphor in a solid solution can be used for white light generation when combined with a blue or ultraviolet light emitting diode.

25 Claims, 19 Drawing Sheets

OTHER PUBLICATIONS

Park et al., "Embodiment of the warm white-light-emitting diodes by using a Ba2+codoped Sr3SiO5: Eu phosphor," Applied Physics Letters, 88, 2006, pp. 043511-1-043511-3.

Park et al., "Investigation of strontium silicate yellow phosphors for white light emitting diodes from a combinatorial chemistry," Applied Physics Letters, 87, 2005, pp. 031108-1-031108-3.

Park et al., "White light-emitting diodes of GaN-based Sr2SiO4: Eu and the luminescent properties," Applied Physics Letters, vol. 82, No. 5, Feb. 3, 2003, pp. 683-685.

Xie et al., "Eu2+-doped Ca-a-SiAlON: A yellow phosphor for white-light emitting diodes," Applied Physics Letters, vol. 84, No. 26, Jun. 28, 2004, pp. 5404-5406.

International Search Report, International application No. PCT/US2009/035425, International filing dated Feb. 27, 2009.

- Space group (*I4/mcm*, 140)
- *a* = *b* = 6.883(2) Å, *c* = 11.042(1) Å

FIG. 16(a)
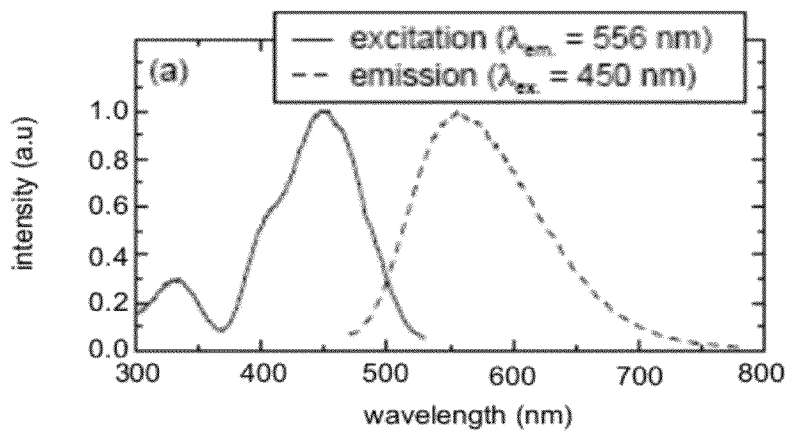
FIG. 16(b)
FIG. 16(c)
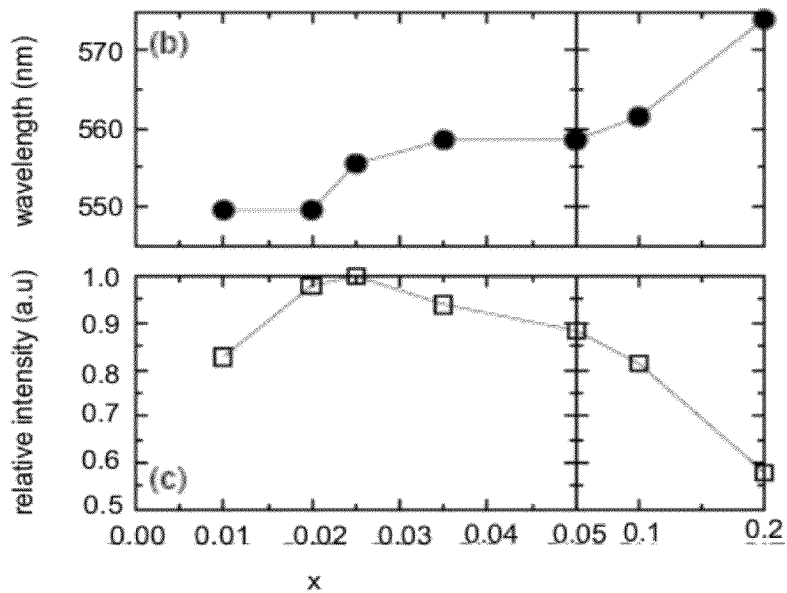

FIG. 18(a)
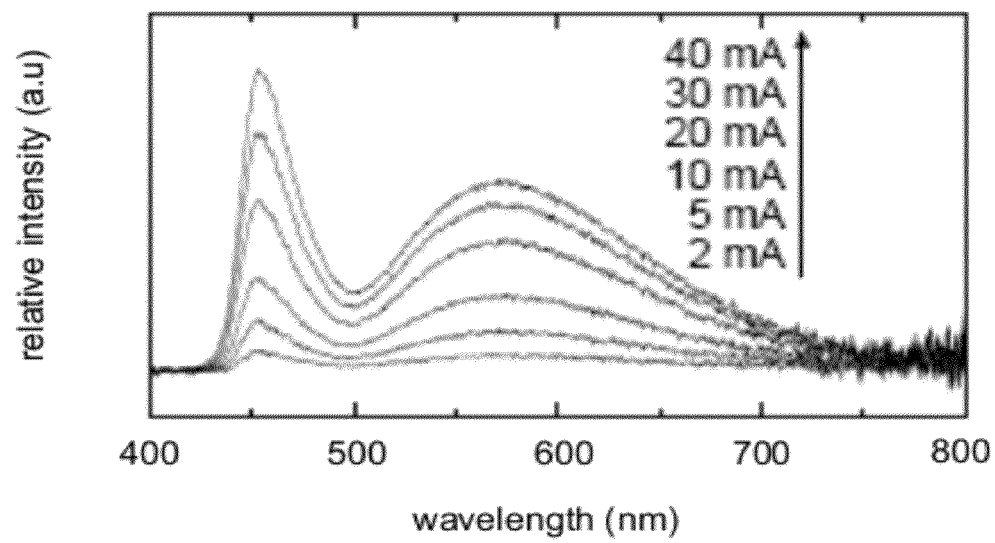
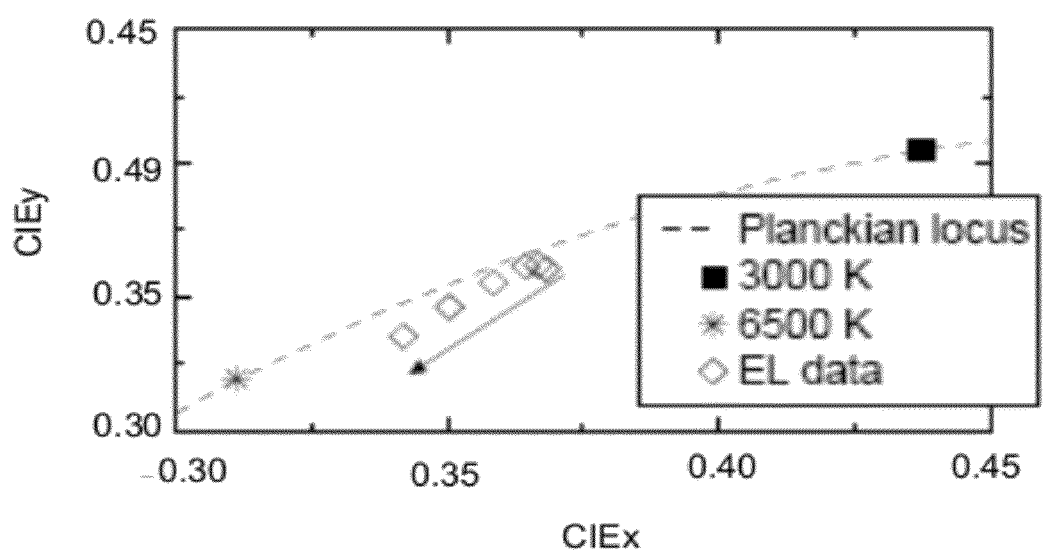
FIG. 18(b)

YELLOW EMITTING PHOSPHORS BASED ON $Ce^{3+}$-DOPED ALUMINATE AND VIA SOLID SOLUTION FOR SOLID-STATE LIGHTING APPLICATIONS

CROSS REFERENCE TO RELATED APPLICATIONS

This application claims the benefit under 35 U.S.C. Section 119(e) of the following co-pending and commonly-assigned applications:

U.S. Provisional Patent Application Ser. No. 61/067,297, filed on Feb. 27, 2008, by Won-Bin Im, Ram Seshadri and Steven P. DenBaars, entitled "Yellow Emitting $Ce^{3+}$-Doped Aluminate Phosphor And White Light Emitting Diodes Including $Ce^{3+}$-Doped Aluminate Phosphor For Solid-State Lighting Applications"; and U.S. Provisional Patent Application Ser. No. 61/074,281, filed on Jun. 20, 2008, by Won-Bin Im, Ram Seshadri and Steven P. DenBaars, entitled "New Yellow-Emitting Phosphors Via Solid Solution And White Light Emitting Diodes Including New Yellow-Emitting Phosphor For Solid-State Lighting Applications", which applications are incorporated by reference herein.

BACKGROUND OF THE INVENTION

1. Field of the Invention

The present invention relates to cerium (Ce) doped phosphor materials for solid-state lighting applications.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

White light-emitting diodes (LEDs) have been considered as next generation light sources as well as components in display devices because of their high efficiency, reliability, and long operating lifetime. In order to make white LEDs, there are basically two methods; one is to mix different red, green, and blue components from LED chips, and the second is to down-convert the emission from a blue LED or ultraviolet (UV) LED to a longer wavelength using a phosphor (e.g. the combination of blue-emission from a blue LED with a yellow-emission from phosphor materials under excitation by the blue light source).

In terms of cost, efficiency, simple fabrication, and high brightness, the second method (coating a yellow-emitting phosphor on a blue LED) has been widely used for fabrication of white LEDs (disclosed in PCT Patent Publication No. WO 98/05078 [9]). In display device applications, for example, such as a backlight unit for a liquid crystal display (LCD), it is also important to obtain a suitable color temperature using the yellow-emitting phosphor.

$Y_3Al_5O_{12}:Ce^{3+}$ (YAG:$Ce^{3+}$) is one of the few phosphor materials for long blue or UV wavelength excitation sources. However, because YAG:$Ce^{3+}$ phosphor has a relatively weak light emitting intensity in the red spectral region, it is difficult to obtain a good color rendering index (CRI, $R_a$).

Consequently, many groups have studied intensively in the field of yellow-emitting phosphors. For example, Park et al. [1] and Xie et al. [2] reported on $Sr_2SiO_4:Eu^{2+}$ and Ca-α-SiAlON:$Eu^{2+}$ phosphors, respectively.

Until now, however, no competing yellow phosphor has been found replace to the YAG:$Ce^{3+}$ phosphor. Nonetheless, there is a need for new yellow phosphors that provide improved efficiency and color rendering properties in the red spectral region. The present invention solves this need and discloses anew yellow-emitting phosphor for solid-state lighting and display applications.

SUMMARY OF THE INVENTION

To overcome the limitations in the prior art described above, and to overcome other limitations that will become apparent upon reading and understanding the present specification, the present invention discloses new phosphors, a $Ce^{3+}$ based aluminate phosphor (first embodiment) and a yellow-emitting phosphor via solid solution (second embodiment) both of which can be used for white light generation when combined with a blue or UV LED.

The $Ce^{3+}$-based aluminate phosphor (first embodiment) may comprise $(Sr_{1-y}A_y)_2(La_{1-x-z}R_z)(Al_{1-u}III_u)O_5:Ce^{3+}_x$, wherein $0<x\leq0.3$, A includes at least one element selected from alkaline earth metals in the periodic table, $0\leq y\leq1$, R includes at least one element selected from lanthanide in the periodic table, $0\leq z\leq1$, III includes at least one element selected from Al, B, Ga, and In, and $0\leq u\leq1$. The phosphor may have a tetragonal space group I4/mcm (No. 140) with lattice parameters a≈b≈6.88 Å and c≈11.04 Å.

The phosphor may include an absorbing ion as a sensitizer that absorbs exciting radiation and transfers it to an activator in the phosphor that emits light having a wavelength longer than a wavelength of the exciting radiation. The phosphor may have x, y, z, and u such that the phosphor is a yellow-emitting phosphor emitting yellow light, a green-orange phosphor emitting light in the green to orange spectral range, or a yellow-red phosphor emitting light in the yellow to red spectral range. For example, x, y, z, and u may be such that the phosphor emits light having a wavelength from 470 nm to 760 nm when excited by blue or ultraviolet light.

The phosphor of the first embodiment may be fabricated using a method comprising the steps of mixing stoichiometric amounts of carbonate or oxide of alkaline earth metals (M), alumina ($Al_2O_3$) and cerium oxide ($CeO_2$) to create a mixture; and heating the mixture to create the $Ce^{3+}$-based aluminate phosphor. The method may further comprise adding flux materials to the mixture, heating the mixture to a temperature between 1000° C. and 1600° C., and/or heating the mixture in a reduction atmosphere.

The present invention further discloses yellow-emitting phosphors based on a solid solution (second embodiment). In particular, the yellow emitting phosphor of the second embodiment may be represented as:

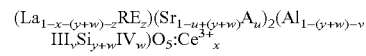

wherein $0<x\leq0.3$, $0\leq u\leq1$, A includes at least one element selected from the alkaline earth metals in the periodic table, for example, Mg, Ca and Ba, $0\leq z\leq1$, RE includes at least one atom selected from the lanthanides in the periodic table, for example, Gd, Tb, and Y, $0\leq v\leq1$, III includes at least one atom selected from Al, B, Ga, and In, $0\leq w\leq1$, IV includes at least one atom selected from Ge and Sn, and $0<y+w<1$. An excitation and emission band of the phosphor composition may be tuned by varying y+w or changing the La amount in the phosphor composition.

The phosphor of the second embodiment may have x, y, w, and z such that the phosphor emits yellow light or orange light, or yellow light and orange light, when excited by blue or ultraviolet light. The emitted light may comprise one or more wavelengths between 537 nm and 560 nm.

The phosphor composition of the second embodiment is typically in a solid solution form. Furthermore, La may be replaced by RE in the solid solution and RE may be Gd or Tb. Alternatively, x−(y+w)−z=1 and RE may be Gd or Tb.

In one variant of the second embodiment, the composition is:

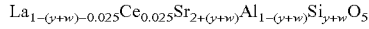
$$La_{1-(y+w)-0.025}Ce_{0.025}Sr_{2+(y+w)}Al_{1-(y+w)}Si_{y+w}O_5$$

with y+w<0.5, so that: the composition is excited by light having an excitation wavelength from 365 nm to 500 nm with a maximum from 410 to 450 nm; and the composition emits light having an emission wavelength centered in a range from 544 nm to 560 nm.

In another variant of the second embodiment, the composition is:

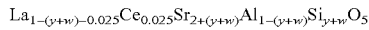
$$La_{1-(y+w)-0.025}Ce_{0.025}Sr_{2+(y+w)}Al_{1-(y+w)}Si_{y+w}O_5$$

with y+w>0.5 so that: the composition is excited by light having an excitation wavelength from 365 nm to 500 nm with a maximum from 410 nm to 420 nm; and the composition emits light having an emission wavelength centered in the range from 537 nm to 545 nm.

The composition of the second embodiment may be fabricated by a method comprising the steps of mixing strontium carbonate ($SrCO_3$), lanthanum oxide ($La_2O_3$), $Al_2O_3$, silicon dioxide ($SiO_2$), and $CeO_2$ in stoichiometric amounts to form a mixture; and heating the mixture between 1000 degrees Celsius (° C.) and 1700° C. in a reduction atmosphere to form the phosphor composition. The method may further comprise adding (during the mixing step) one or more of the following flux materials: $Li_2CO_3$, $SrF_2$, $BaF_2$, $NH_4Cl$, $NH_4F$, $H_3BO_3$, and $AlF_3$, in the range of 0.005 to 30 percentage by weight (wt %), performing the mixing step using an agate mortar for 30 minutes, heating the mixture two or more times to achieve higher crystallinity for the sample, thereby enhancing one or more optical properties of the phosphor sample, and/or providing the reduction atmosphere by supplying a gas mixture having both nitrogen and hydrogen, wherein the hydrogen is 2 to 25% by volume such that the hydrogen's volume in the gas mixture is 2-25% of the gas mixture's volume.

A method of fabricating or preparing a white LED using the present invention's phosphors is also disclosed. An apparatus for solid state lighting applications may comprise an LED and the $Ce^{3+}$-based aluminate phosphor positioned adjacent the LED that emits light when excited by radiation from the LED. Alternatively, a blue or UV LED may be optically coupled to the phosphor composition of the second embodiment, for example.

BRIEF DESCRIPTION OF THE DRAWINGS

Referring now to the drawings in which like reference numbers represent corresponding parts throughout:

FIG. 8 is a graph of measured XRD patterns of

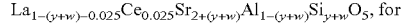
$$La_{1-(y+w)-0.025}Ce_{0.025}Sr_{2+(y+w)}Al_{1-(y+w)}Si_{y+w}O_5, \text{ for}$$

(a) $La_{0.975}Ce_{0.025}Sr_2AlO_5$ (y+w=0),
(b) $La_{0.775}Ce_{0.025}Sr_{2.2}Al_{0.8}Si_{0.2}O_5$ (y+w=0.2), and
(c) $La_{0.575}Ce_{0.025}Sr_{2.4}Al_{0.6}Si_{0.4}O_5$ (y+w=0.4), wherein vertical lines at the top of the figure indicate the reflection positions.

Figure 9:
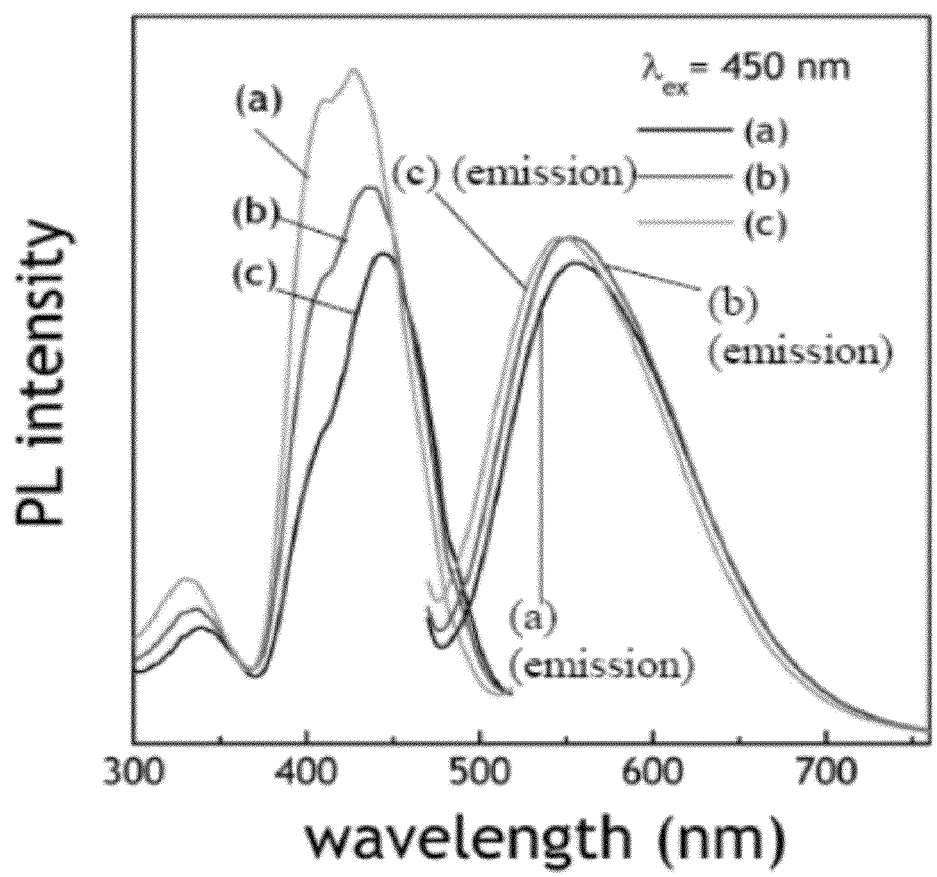

FIG. 9 shows measured excitation and emission spectra (Photoluminescence (PL) intensity as function of emission wavelength and excitation wavelength in nm) of

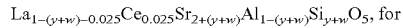
$$La_{1-(y+w)-0.025}Ce_{0.025}Sr_{2+(y+w)}Al_{1-(y+w)}Si_{y+w}O_5, \text{ for}$$

(a) $La_{0.975}Ce_{0.025}Sr_2AlO_5$ (y+w=0)
(b) $La_{0.775}Ce_{0.025}Sr_{2.2}Al_{0.8}Si_{0.2}O_5$ (y+w=0.2), and
(c) $La_{0.575}Ce_{0.025}Sr_{2.4}Al_{0.6}Si_{0.4}O_5$ (y+w=0.4), wherein the emission spectra are indicated by "emission," and the emission spectra are obtained for the phosphors excited with $\lambda_{ex}$=450 nm wavelength light.

Figure 10:
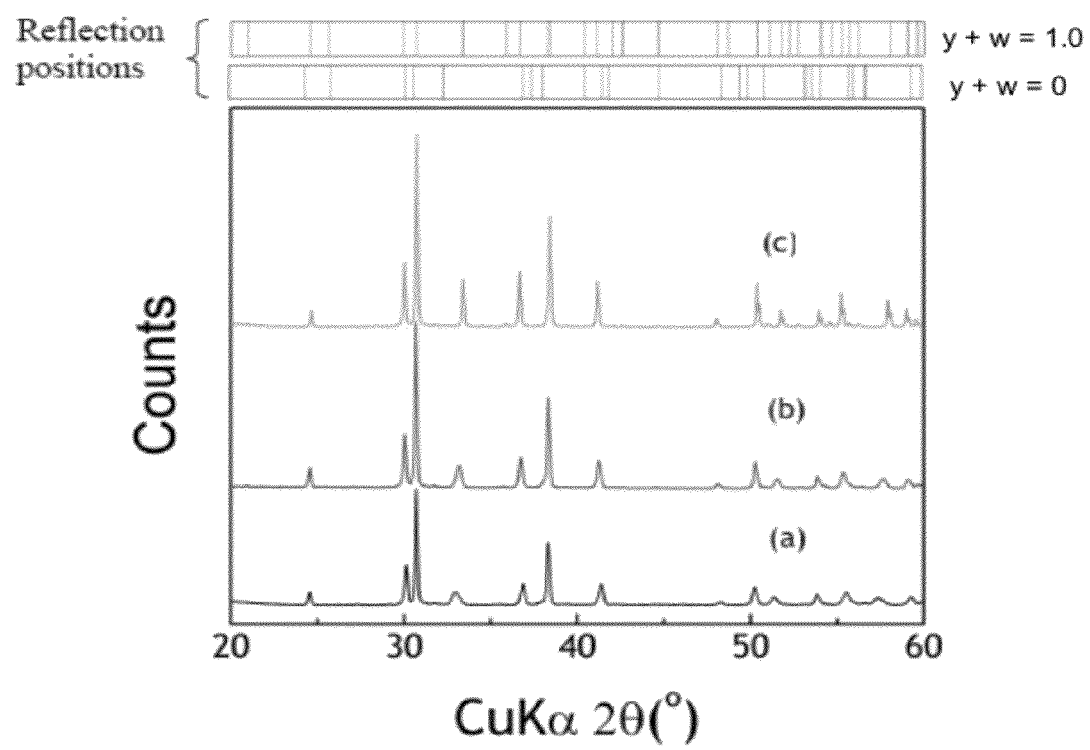

FIG. 10 is a graph of measured XRD patterns of

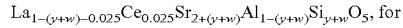
$$La_{1-(y+w)-0.025}Ce_{0.025}Sr_{2+(y+w)}Al_{1-(y+w)}Si_{y+w}O_5, \text{ for}$$

(a) $La_{0.375}Ce_{0.025}Sr_{2.6}Al_{0.4}Si_{0.6}O_5$ (y+w=06)
(b) $La_{0.175}Ce_{0.025}Sr_{2.8}Al_{0.2}Si_{0.8}O_5$ (y+w=0.8), and
(c) $Sr_{2.975}Ce_{0.025}SiO_5$ (y+w=1.0), wherein vertical lines at the top of the figure indicate the reflection positions.

Figure 11:
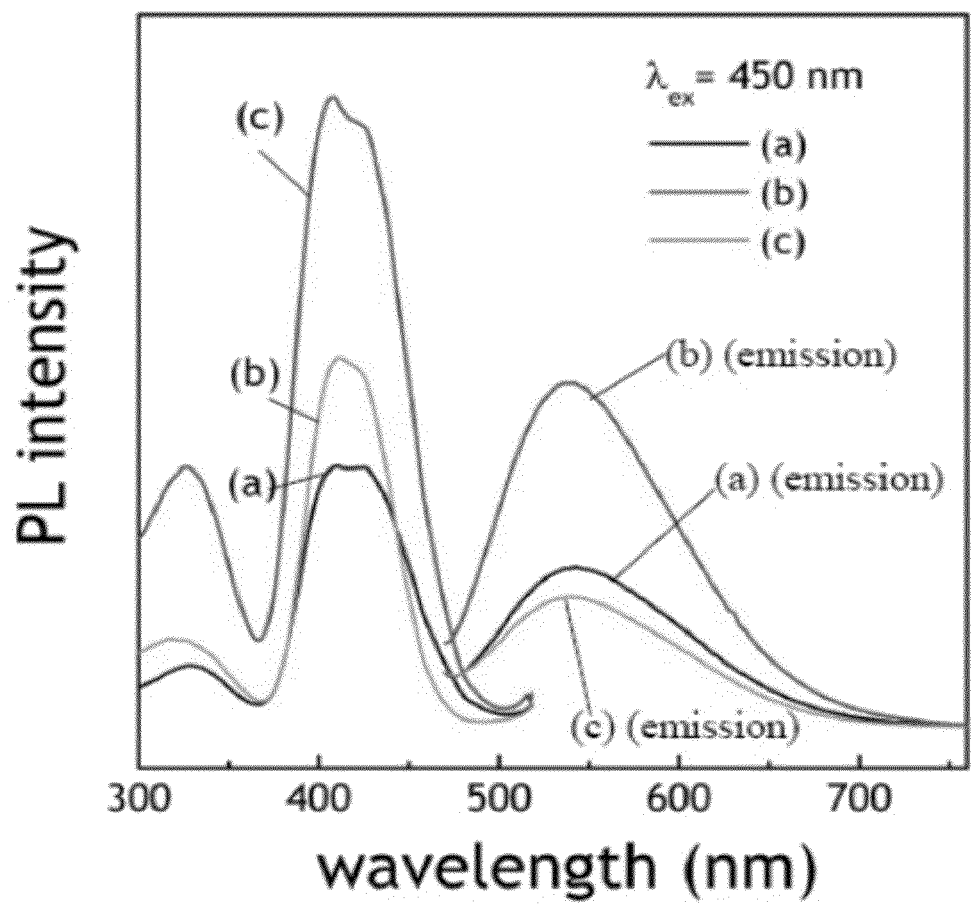

FIG. 11 shows measured excitation and emission spectra (PL intensity as function of emission wavelength and excitation wavelength in nm) of

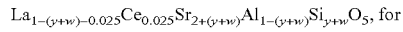
$$La_{1-(y+w)-0.025}Ce_{0.025}Sr_{2+(y+w)}Al_{1-(y+w)}Si_{y+w}O_5, \text{ for}$$

(a) $La_{0.375}Ce_{0.025}Sr_{2.6}Al_{0.4}Si_{0.6}O_5$ (y+w=06)
(b) $La_{0.175}Ce_{0.025}Sr_{2.8}Al_{0.2}Si_{0.8}O_5$ (y+w=0.8), and
(c) $Sr_{2.975}Ce_{0.025}SiO_5$ (y+w=1.0), wherein the emission spectra are indicated by "emission" and the emission spectra are obtained for the phosphors excited with $\lambda_{ex}$=450 nm wavelength light.

Figure 12:
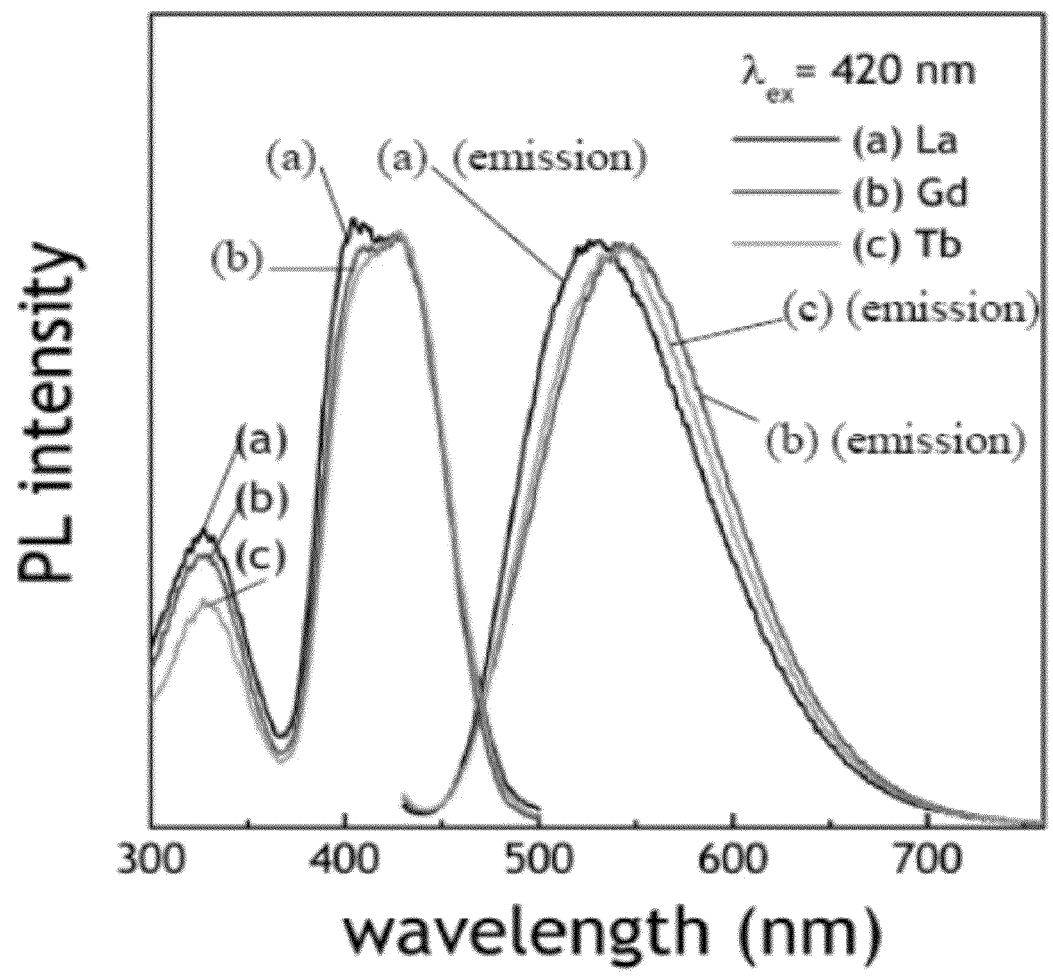

FIG. 12 shows measured excitation and emission spectra (PL intensity as function of emission wavelength and excitation wavelength in nm) of $RE_{0.175}Ce_{0.025}Sr_{2.8}Al_{0.2}Si_{0.8}O_5$, for (a) $La_{0.175}Ce_{0.025}Sr_{2.8}Al_{0.2}Si_{0.8}O_5$, (b) $Gd_{0.175}Ce_{0.025}Sr_{2.8}Al_{0.2}Si_{0.8}O_5$, and (c) $Tb_{0.175}Ce_{0.025}Sr_{2.8}Al_{0.2}Si_{0.8}O_{55}$, wherein the emission spectra are indicated by "emission," and the emission spectra are obtained for the phosphors excited with $\lambda_{ex}$=420 nm wavelength light.

Figures 13A, 13B:
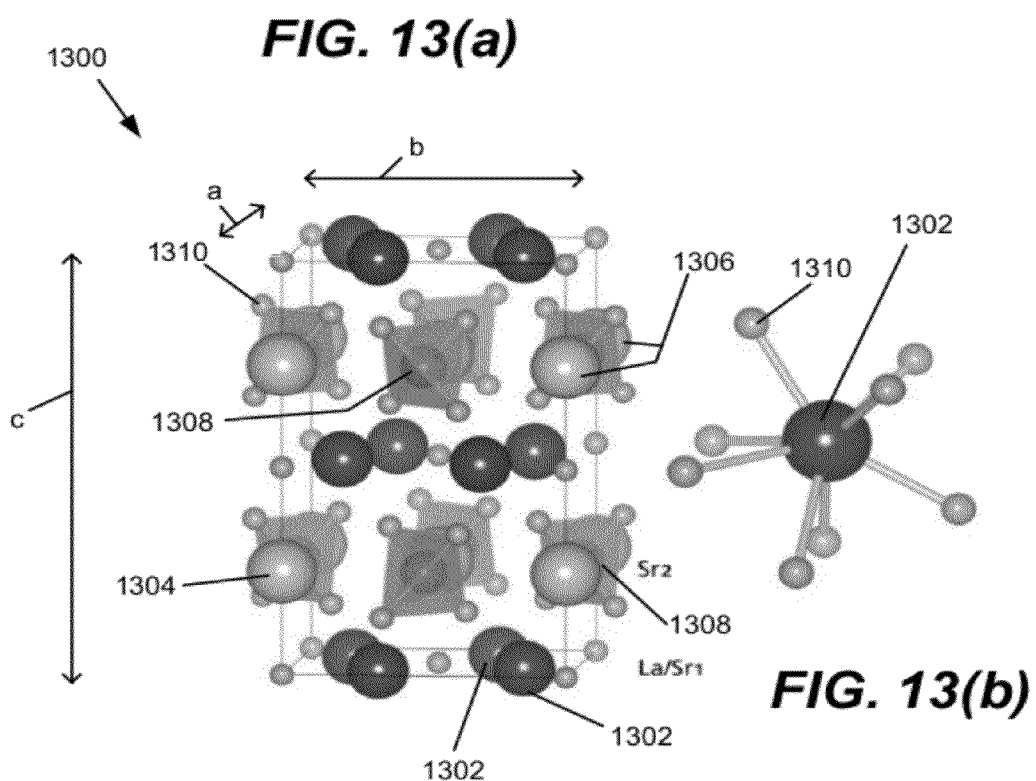

FIG. 13(a) and FIG. 13(b) are schematics of the crystal structure of the first embodiment of the present invention.

Figure 14:
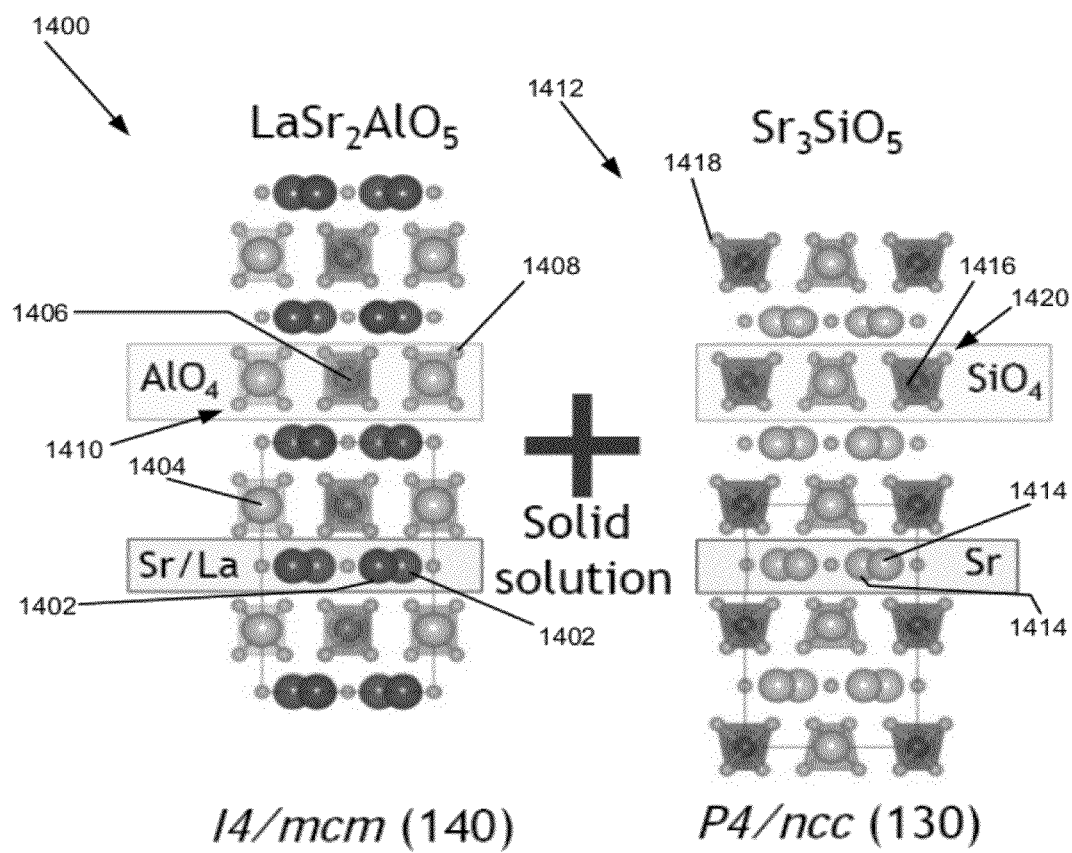

FIG. 14 is a schematic of the crystal structure of the second embodiment of the present invention.

Figure 15:
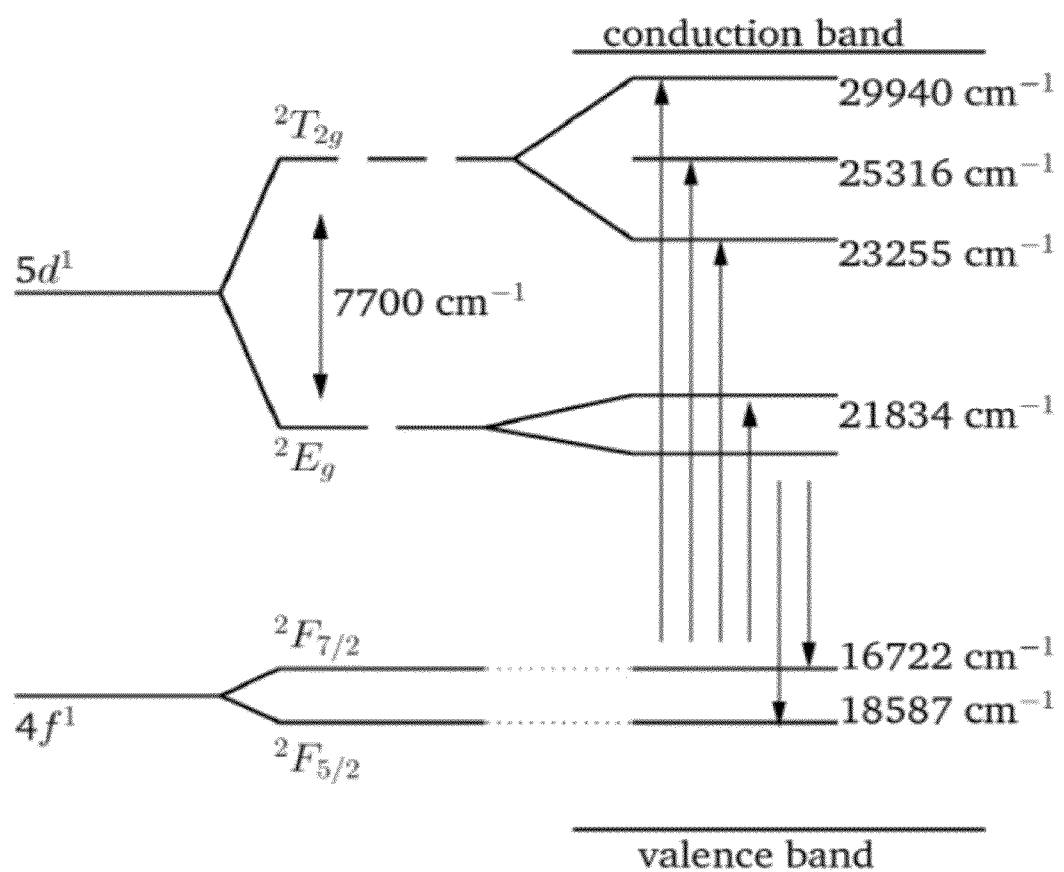

FIG. 15 is a schematic energy level diagram for $La_{1-x}Ce^{3+}{}_xSr_2AlO_5$.

FIG. 16(a) plots emission (dashed) and excitation (dotted) spectra of $La_{0.975}Ce_{0.025}Sr_2AlO_5$, in terms of intensity (a.u) vs. wavelength λ (nm), FIG. 16(b) plots position of the emission maximum $\lambda_{max}$ as a function of $Ce^{3+}$ substitution x in $La_{1-x}Ce_xSr_2AlO_5$, and FIG. 16(c) plots relative luminescence intensity as a function of $Ce^{3+}$ substitution x in $La_{1-x}Ce_xSr_2AlO_5$.

Figure 17:
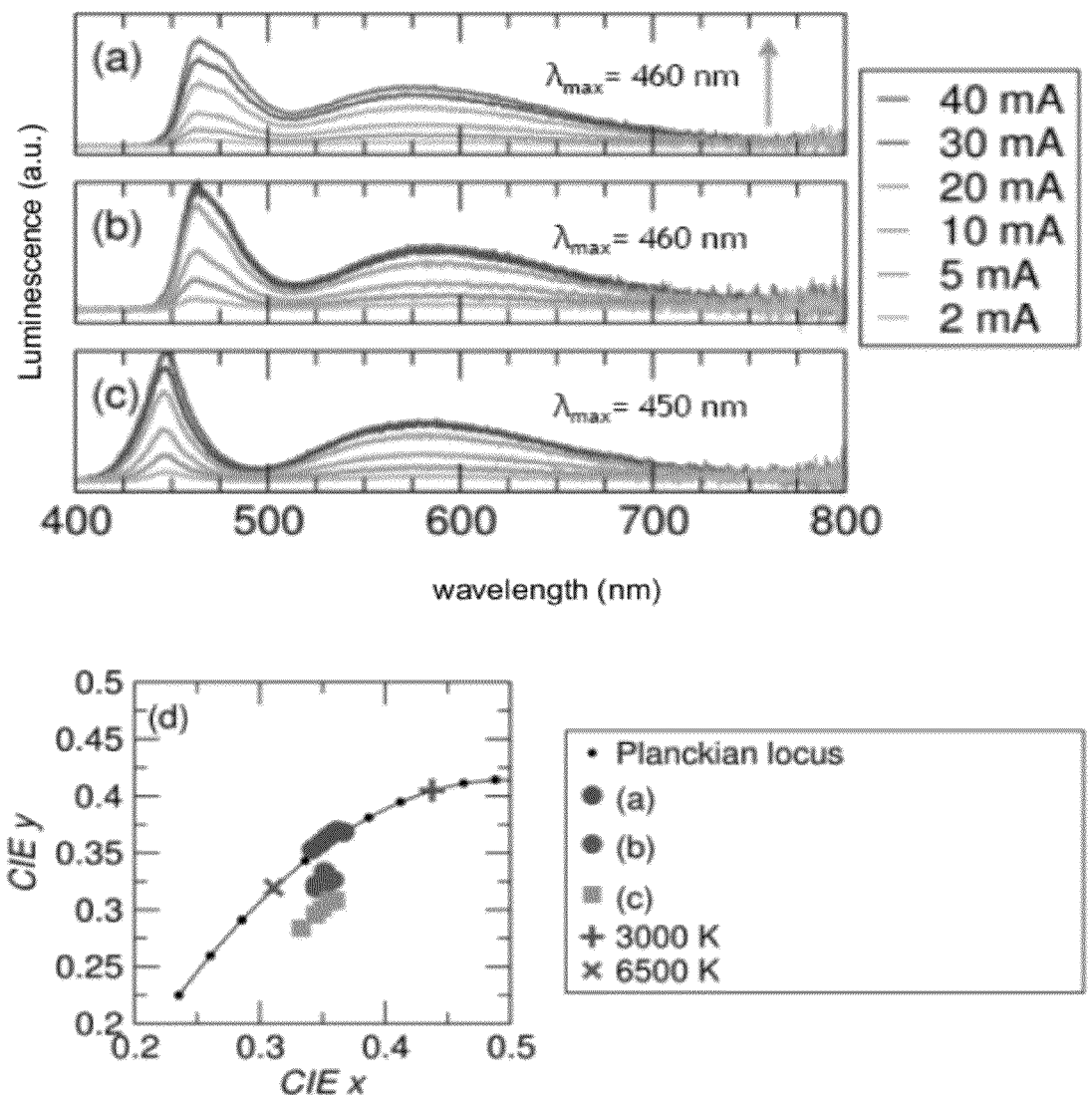

FIG. 17 plots the luminescence intensity emitted by a white LED comprising an InGaN LED with a phosphor according to the first embodiment, as a function of wavelength of the luminescence in nm, and under different forward bias currents (the luminescence curves are, from bottom to top, for 2 milliamps (mA), 5 mA, 10 mA, 20 mA, 30 mA, and 40 mA bias current), wherein in (a) the maximum excitation wavelength of the light emitted by the InGaN LED ($\lambda_{max}$) is 460 nm, in (b) the phosphor further comprises Ba and $\lambda_{max}$=460 nm, in (c) the phosphor further comprises Gd and Tb and $\lambda_{max}$=450 nm, and (d) plots CIE x v. CIE y, showing the Planckian locus, color co-ordinates (x,y) for the white LEDs in (a)-(c), and color temperatures 3000 Kelvin (K) (+) and 6500 K (X).

FIG. 18(a) plots the luminescence intensity emitted by a white LED comprising an InGaN LED with a phosphor, as a function of wavelength of the luminescence in nm, and under different forward bias currents (the luminescence curves are from bottom to top, for 2 mA, 5 mA, 10 mA, 20 mA, 30 mA, and 40 mA bias current), wherein in FIG. 18(a) the phosphor is a variant of the first embodiment, and FIG. 18(b) plots CIE x vs. CIE y showing the Planckian locus, color co-ordinates (x,y) for the white LED in FIG. 18(a) as a function of the different bias currents (EL, open diamonds, arrow points in direction of increasing bias current), and color temperatures 3000 K (squares) and 6500 K (stars).

Figure 19C:
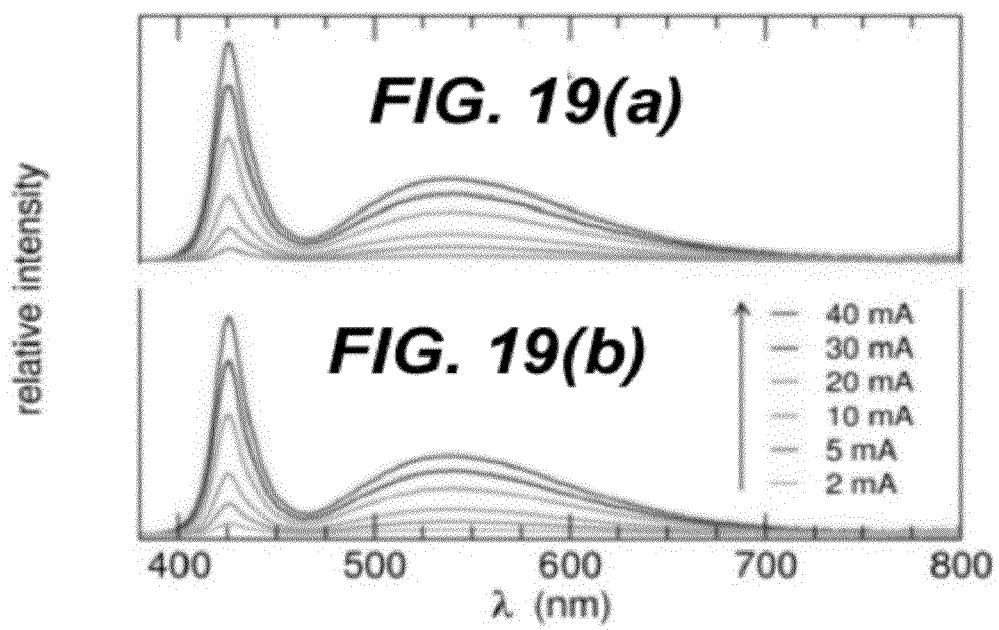
Figure 19C:
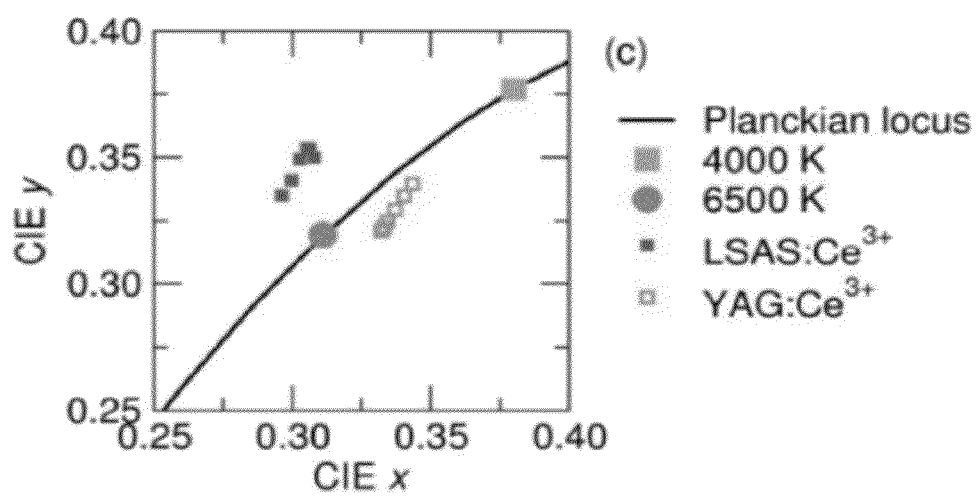

FIGS. 19(a)-(b) plot the luminescence intensity emitted by a white LED comprising an InGaN LED with a phosphor, as a function of wavelength of the luminescence in nm, and under different forward bias currents (the luminescence curves are from bottom to top, for 2 mA, 5 mA, 10 mA, 20 mA, 30 mA, and 40 mA bias current), wherein in FIG. 19(a) the phosphor is $YAG:Ce^{3+}$, in FIG. 19(b) the phosphor is a variant of the second embodiment, and FIG. 19(c) plots CIE x vs. CIE y showing Planckian locus, color co-ordinates (x,y) for the white LEDs in FIG. 19(a), and color temperatures 4000 K (larger squares) and 6500 K (circles).

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The present invention relates to a phosphor, a white LED including the phosphor, and a method of making the phosphor.

In particular, the phosphor of the first embodiment is a $Ce^{3+}$-activated or $Ce^{3+}$-doped aluminate phosphor powder, which is defined as:

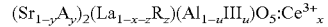

wherein $0<x\leq0.3$, $0\leq y\leq1$, A includes at least one element selected from alkaline earth metals in the periodic table, for example, Mg, Ca and Ba, $0\leq z\leq1$ and R includes at least one element selected from lanthanide in the periodic table, for example, Gd, Tb, and Y, $0\leq u\leq1$ and III includes at least one element selected from Al, B, Ga, and In. The phosphor of the present invention shows a broad band emission from 470 to 760 nm when it was excited by an InGaN-based blue LED and a GaN-based long wavelength ultraviolet LED.

A yellow emitting phosphor according to a second embodiment is represented as:

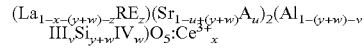

wherein $0<x\leq0.3$, $0\leq u\leq1$, A includes at least one element selected from the alkaline earth metals in the periodic table, for example, Mg, Ca and Ba, $0\leq z\leq1$, RE includes at least one atom selected from the lanthanides in the periodic table, for example, Gd, Tb, and Y, $0\leq v\leq1$, III includes at least one atom selected from Al, B, Ga, and In, $0\leq w\leq1$, IV includes at least one atom selected from Ge and Sn, and $0<y+w<1$. The phosphor of the second embodiment shows a broad band emission from 430 to 760 nm when excited by an existing InGaN-based blue LED and a GaN-based long wavelength ultraviolet LED.

The LED using the phosphors of the present invention have a good color rendering property over a wide spectral range, and high efficiency for white lighting when used as a LED for solid-state lighting, and as a backlight source for an LCD.

Technical Description of the First Embodiment

This present invention is concerned with $Ce^{3+}$ based aluminate phosphor materials for solid-state lighting applications. In this regard, this invention can be used for white light generation by combining either a blue LED and a yellow emitting $Ce^{3+}$ based aluminate phosphor, or a blue LED and a green-orange emitting $Ce^{3+}$ based aluminate phosphor, or a blue LED and yellow-red emitting $Ce^{3+}$ based aluminate phosphor.

For example, in order to develop a yellow-emitting phosphor under blue excitation, it is very important to choose an appropriate host lattice with a strong crystal field around the activator ion. For example, most $Ce^{3+}$-activated phosphors show a typical long UV or blue emission, except the $YAG:Ce^+$ phosphor. It is reported that the cubic crystal field at the $Ce^{3+}$ site associated with a small tetragonal distortion is responsible for this unusual yellow emission.

In this regard, the crystal field around $Ce^{3+}$ ions, based on the given basic formula, has been predicted as:

$$\Delta = Dq = \frac{Ze^2r^4}{6R^5} \infty \frac{1}{R^5}$$

wherein:

Dq is the crystal field at octahedral symmetry,

R is the distance between a center ion and ligand ions,

Z is the charge, e is the electron charge, and r is the radius of the d wavefunction.

With the consideration of the crystal field effect around $Ce^{3+}$ ions, and the shorter distance between a center ion and ligand ions, the stronger crystal field is around the center ion.

The present invention also has a relatively shorter distance between the $Ce^{3+}$ ion and O ligand ions.

As noted earlier, there are generally two methods for generating white light from LEDs: (1) mixing red, green, and blue components from LEDs, or (2) down-converting the emission from a blue LED or UV LED to a longer wavelength using a phosphor. The present invention uses the second method, namely, a combination of a blue LED and a yellow-emitting phosphor.

Figure 1:
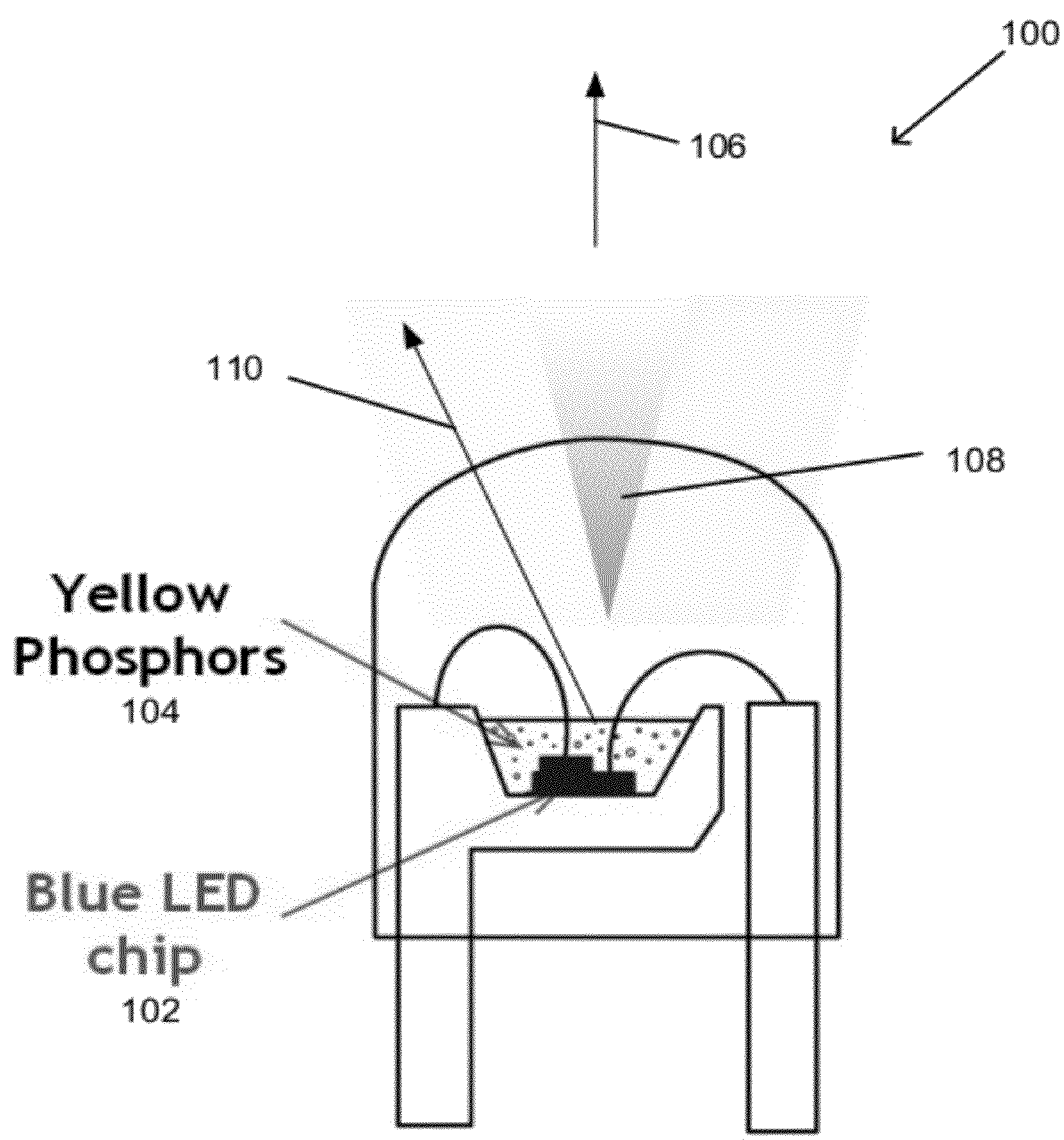
FIG. 1 illustrates a schematic structure of white LED based on yellow phosphor according to the first embodiment of the present invention.

FIG. 1 is a schematic view of a white LED 100 comprising a blue LED 102 using a yellow emitting $Ce^{3+}$-activated aluminate phosphor (yellow phosphor) 104 of the present invention, resulting in the emission of white light 106. In one embodiment, the blue LED chip 102 is an InGaN-based blue LED having a dominant wavelength of 450 nm (emitting blue light 108), used with the yellow emitting $Ce^{3+}$-activated aluminate phosphor emitting yellow light 110. FIG. 1 illustrates how a blue or ultraviolet LED 102 may be optically coupled to the phosphor composition(s) 104 of the present invention. For example, an apparatus 100 for solid state lighting applications may comprise an LED 102 and a $Ce^{3+}$-based aluminate phosphor 104, positioned adjacent the light emitting diode 102, that emits light 110 when excited by radiation from the light emitting diode 102.

Process Steps of the First Embodiment

Figure 2:
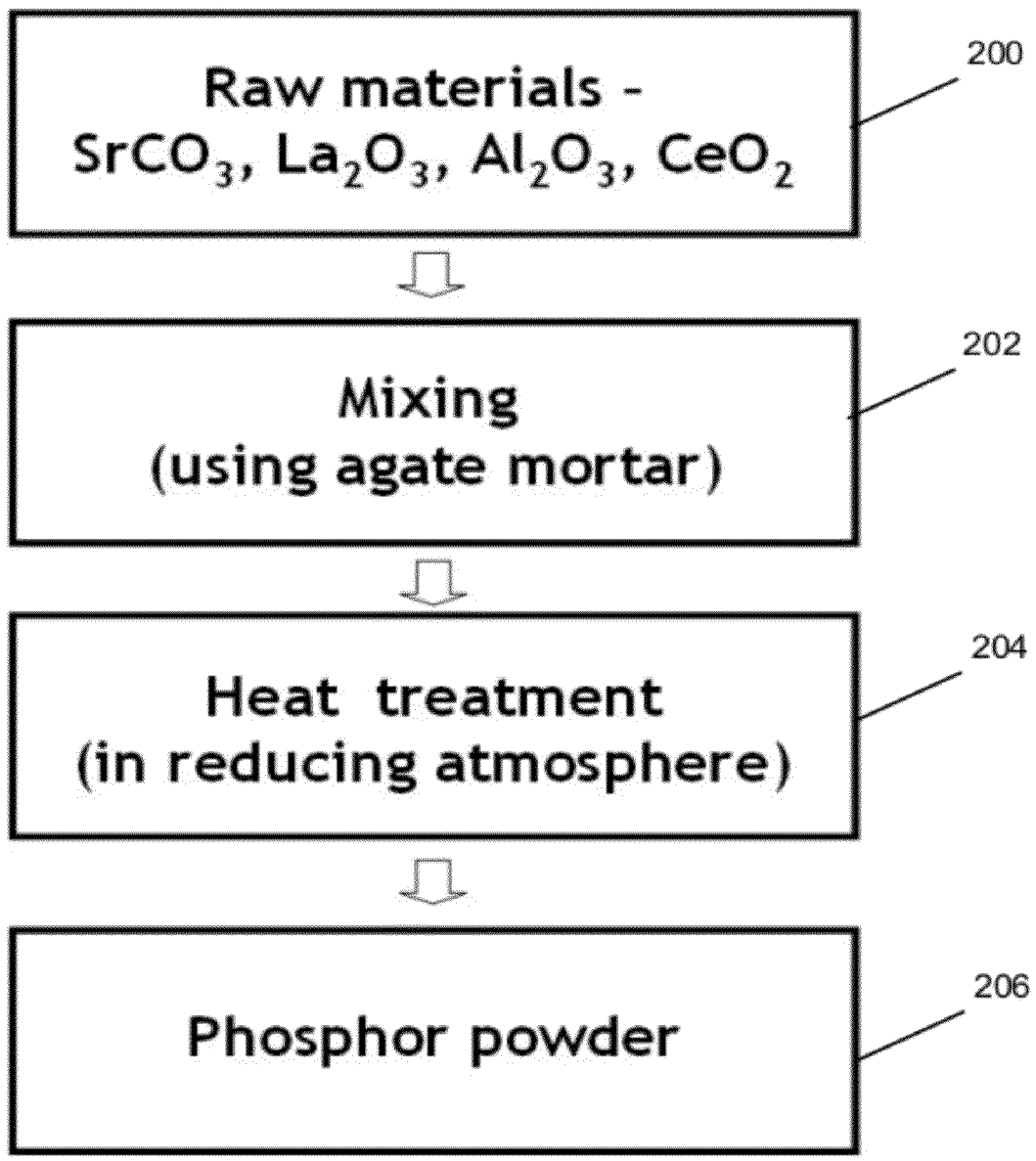
FIG. 2 is a flowchart illustrating an experimental procedure, a method for creating a $Ce^{3+}$-based aluminate phosphor, according to the first embodiment of the present invention.

FIG. 2 is a flowchart illustrating the process steps used in the first embodiment of the present invention.

Block 200 represents selecting the raw materials. Specifically, in order to synthesize $(Sr_{1-y}A_y)_2(La_{1-x-z}R_z)(Al_{1-u}III_u)O_5:Ce^{+3}_x$ phosphor samples, $CaCO_3$, $SrCO_3$, $BaCO_3$, $La_2O_3$, gadolinium oxide ($Gd_2O_3$), terbium oxide ($Tb_4O_7$), $Al_2O_3$, $H_3BO_3$, $Ga_2O_3$, $In_2O_3$, $Sc_2O_3$ and $CeO_2$ are used as raw materials in stoichiometric amounts. In particular, carbonate or oxide of alkaline earth metals, $Al_2O_3$ and $CeO_2$ may be used. Alternatively, flux materials, $Li_2CO_3$, $SrF_2$, $BaF_2$, $NH_4Cl$, $NH_4F$, $H_3BO_3$, and $AlF_3$, may be added, in a range of 0.005 to 30 wt % for high crystallinity and efficient emission from the phosphor samples.

Block 202 represents mixing the raw materials using an agate mortar for 30 minutes to create a mixture.

Block 204 represents the subsequent heating of the mixture to create the $Ce^{3+}$-based aluminate phosphor (heat treatment). Specifically, the mixture is heated to a temperature between 1000° C. and 1600° C. in a reduction atmosphere (under reducing atmosphere). In order to enhance their optical properties, it is possible to heat the materials two or more times to provide for high crystallinity. Moreover, it is preferable that the reduction atmosphere be provided by supplying a nitrogen mixture gas whose hydrogen content is 2 to 25% by volume on basis of the volume of mixture gas (for example, the hydrogen volume is 2-25% of the total gas mixture volume).

Block 206 represents the end result of the process, namely the desired phosphor powder comprising a $Ce^{3+}$-based aluminate phosphor powder. Specifically, the $Ce^{3+}$-based aluminate phosphor powder comprises or is defined as:

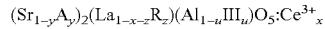

wherein $0<x\leq0.3$, A includes at least one element selected from alkaline earth metals in the periodic table such that $0\leq y\leq1$, R includes at least one element selected from lanthanide in the periodic table such that $0\leq z\leq1$, and III includes at least one element selected from Al, B, Ga, and In such that $0\leq u\leq1$. The phosphor may further include an absorbing ion as a sensitizer that absorbs exciting radiation and transfers it to an activator in the phosphor that emits light (e.g. having a wavelength longer than a wavelength of the exciting radiation).

In a first variant of the first embodiment of the present invention, the raw materials of the phosphor are $SrCO_3$, $La_2O_3$, $Al_2O_3$ and $CeO_2$. As described above, Sr can be replaced by alkaline earth elements, such as Mg, Ca and Ba, etc., if required. The synthesis condition is the same as noted above.

Experimental Results of the First Embodiment

Figure 3:
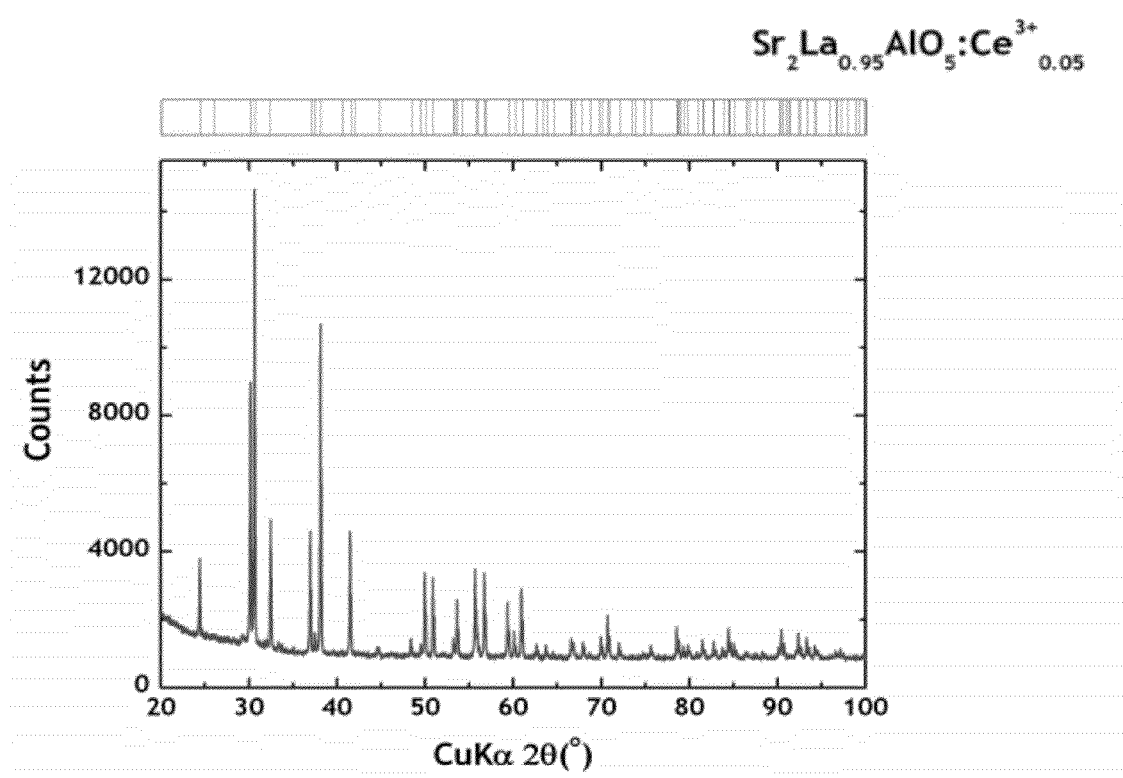
FIG. 3 is a graph that illustrates the Rietveld refinement of the powder X-ray diffraction (XRD) profile of $Sr_2La_{0.95}AlO_5:Ce^{3+}_{0.05}$.

Experimentally, a single phase of a $Sr_2La_{0.95}AlO_5:Ce^{3+}_{0.05}$ phosphor sample was obtained, as shown in FIG. 3. The phosphor powder has a structure defined as a tetragonal space group I4/mcm (No. 140), with lattice parameters $a\approx b\approx 6.88$ Å and $c\approx 11.04$ Å, based on the Rietveld refinement with XRD data.

Figure 4:
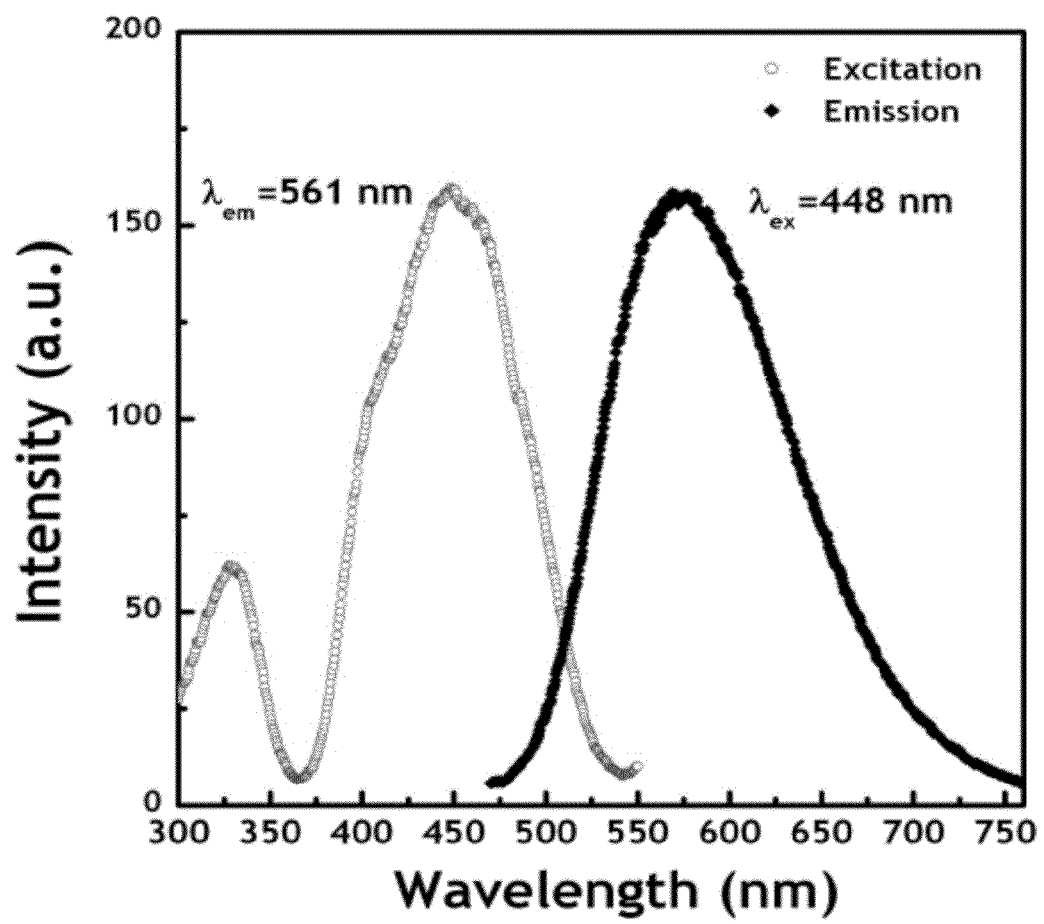
FIG. 4 is a graph that illustrates the excitation and emission spectra of the $Sr_2La_{0.95}AlO_5:Ce^{3+}_{0.05}$ phosphor, plotting intensity of emission, in arbitrary units, a.u., as a function of the excitation wavelength (wavelength of the light exciting the phosphor) and emission wavelength (wavelength of light emitted by the phosphor in response to, or down-converting, the excitation wavelength) in nanometers (nm), showing a peak excitation wavelength $\lambda_{ex}$=448 nm and a peak emission wavelength $\lambda_{em}$=561 nm.

FIG. 4 shows the luminescent property of the component of FIG. 3 (first variant of the first embodiment) has a broad excitation band from 365 nm to 520 nm with a maximum at 450 nm. This component (first variant) has an emission band centered at 561 nm with a relatively broad full width at half maximum value (FWHM) in comparison with the $YAG:Ce^{3+}$ phosphor. The color coordinate of this component is (0.434, 0.553), as shown in FIG. 5.

In second and third variants of the first embodiment of the present invention, the raw materials of the phosphor are $SrCO_3$, $Al_2O_3$, $CeO_2$, and $Gd_2O_3$ (second variant) or $Tb_4O_7$ (third variant). The synthesis conditions are the same as noted above.

Figure 6:
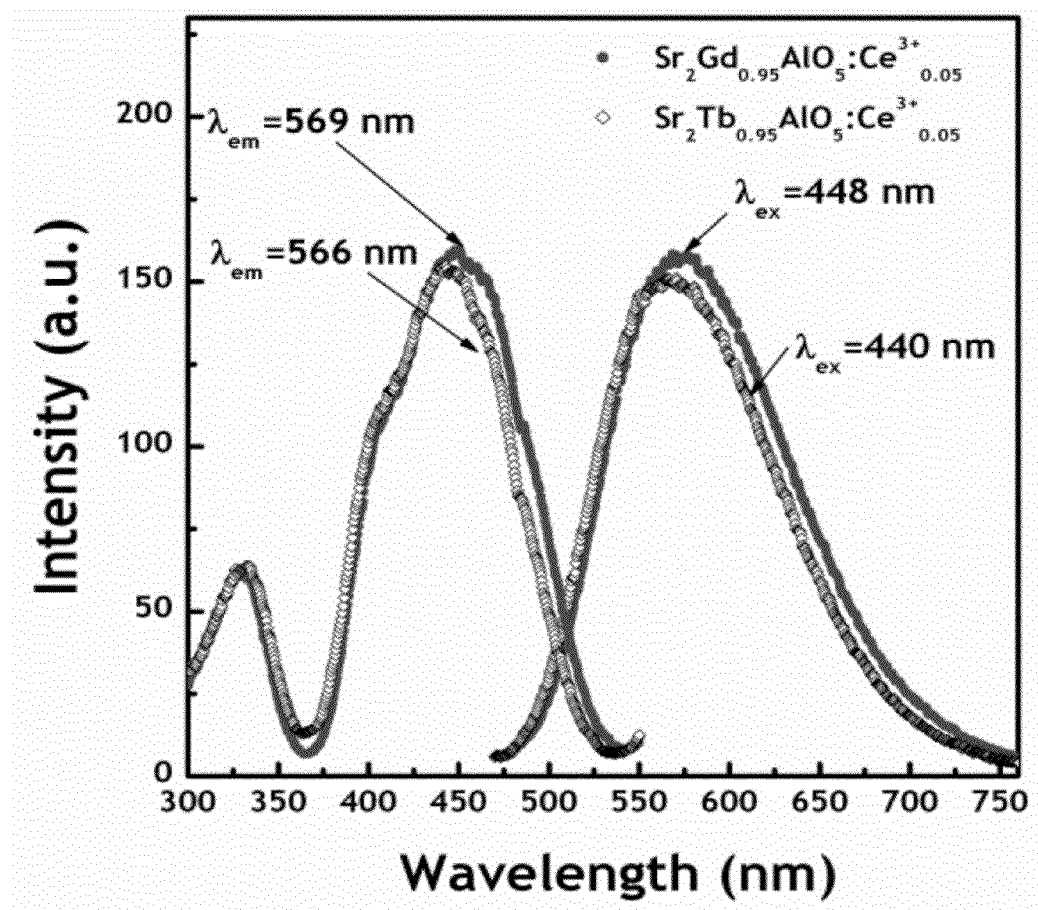
FIG. 6 a is graph that illustrates the excitation and emission spectra of both $Sr_2Gd_{0.95}AlO_5:Ce^{3+}_{0.05}$ (solid or full circles) and $Sr_2Tb_{0.95}AlO_5:Ce^{3+}_{0.05}$ (open diamonds), plotting intensity of emission, in a.u., as a function of the emission wavelength and excitation wavelength in nm, showing a peak excitation wavelength $\lambda_{ex}$=448 nm and a peak emission wavelength $\lambda_{em}$=569 nm for $Sr_2Gd_{0.95}AlO_5:Ce^{3+}_{0.05}$, and a peak excitation wavelength $\lambda_{ex}$=440 nm and a peak emission wavelength $\lambda_{em}$=566 nm for $Sr_2Tb_{0.95}AlO_5:Ce^{3+}_{0.05}$.

As shown in FIG. 6, the luminescent properties of both components (the second and third variants) have a broad excitation band from 365 nm to 520 nm with a maximum at 440 nm and 448 nm, corresponding to the Tb and Gd ions, respectively (which ions are used instead of the La ion). FIG. 6 shows that the peaks of the emission spectra for the second and third variants were centered at 569 nm and 566 nm, respectively. This means that the change of lanthanide ions in the host lattice can tune the phosphor's dominant emission wavelength and excitation maximum with ease. Due to these attractive properties, a white light LED can be obtained by combining a blue LED with the yellow-orange phosphors of the present invention. In addition, if required, La can be partially replaced by lanthanide elements, such as Gd, Tb and Y, etc.

Figure 5:
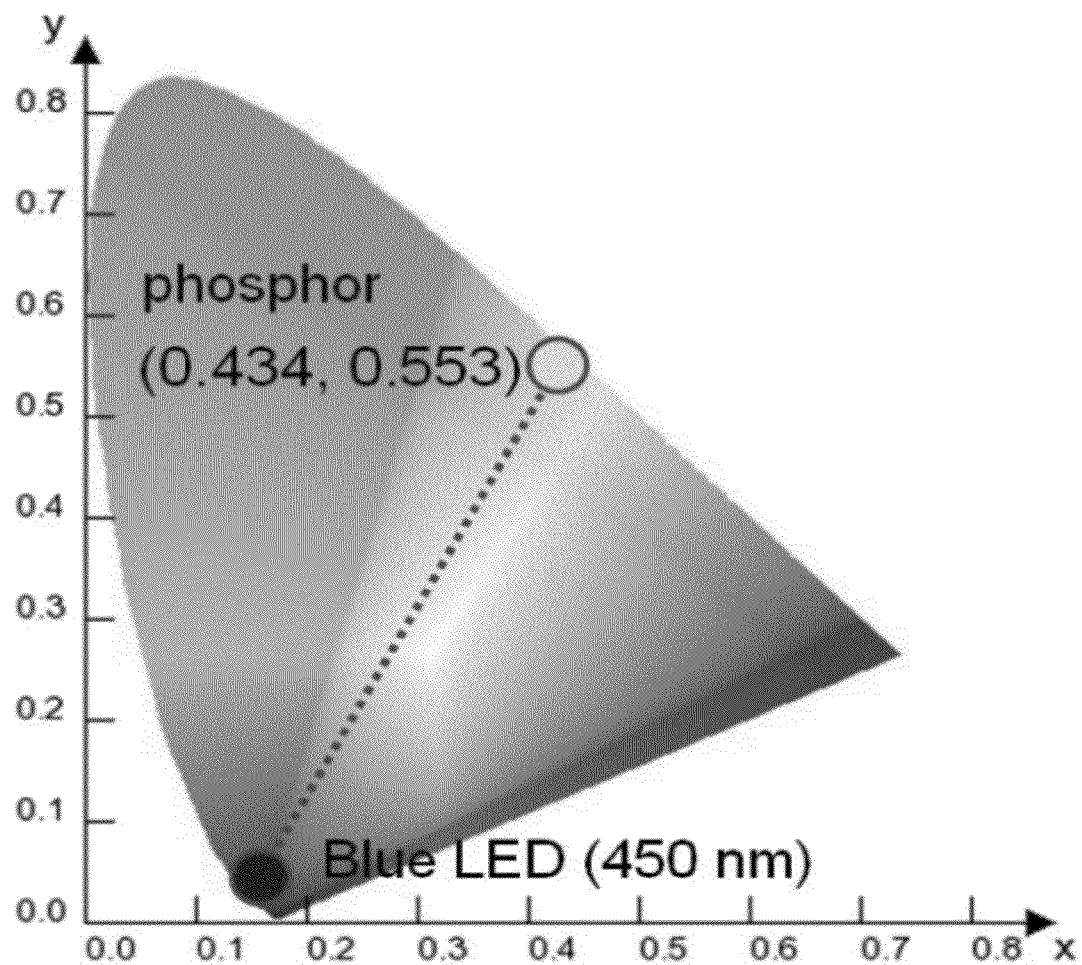
FIG. 5 is a graph that illustrates the Commission International de l'Eclairage (CIE) color gamut of $Sr_2La_{0.95}AlO_5:Ce^{3+}_{0.05}$, in terms of color co-ordinates x and y.

Thus, FIGS. 4-6 illustrate that the first embodiment may have one or more of x, y, z, and u so that the first embodiment is a yellow-emitting phosphor emitting yellow light, a green-orange phosphor emitting light in the green to orange spectral range, or a yellow-red phosphor emitting light in the yellow to red spectral range. For example, FIGS. 4-6 illustrate that x, y, z, and u may be such that the phosphor emits light having a wavelength from 470 nm to 760 nm when excited by blue or ultraviolet light.

Possible Modifications and Variations of the First Embodiment

In the present invention, as noted above, the formula of the phosphor composition is defined as follows:

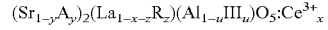

wherein $0<x\leq0.3$, $0\leq y\leq1$, A includes at least one element selected from alkaline earth metals in the periodic table, for example, Mg, Ca and Ba, $0\leq z\leq1$ and R includes at least one element selected from lanthanide in the periodic table, for example, Gd, Tb, and Y, $0 \leq u \leq 1$ and III includes at least one element selected from Al, B, Ga, In, and Sc.

In particular, the efficiency of the phosphor may be enhanced by adding another ion to the host lattice, wherein this additional ion may absorb the exciting radiation and subsequently transfer it to the activator. In this case, the absorbing ion is known as a "sensitizer," wherein a small amount of Pr, Nd, Sm, Eu, Dy, Ho, Er, Tm, Yb, Lu, Mn, Zn, and Bi can be added to the host lattice as the sensitizer. In the case of a divalent ion among the sensitizers, the phosphor may be comprised of more ions chosen from the group formed by $Li^+$, $Na^+$, and $K^+$, for charge compensation.

With regard to the method of synthesis of the present invention, it is possible to apply various methods, including but not limited to, spray pyrolysis methods, co-precipitation methods, sol-gel methods, solvothermal methods, and hydrothermal methods, etc.

And, as far as white LED generation is concerned, the present invention also can be used with various combinations of: a blue LED and yellow-emitting phosphors, a blue LED and green-orange phosphors, or a blue LED and yellow-red phosphors, depending upon various color requirements.

The phosphor composition $$(Sr_{1-y}A_y)_2(La_{1-x-z}R_z)(Al_{1-u}III_u)O_5:Ce^{3+}_x$$

can have x, y, w, and z such that the phosphor composition is used for white light applications in combination with one or more red, green, and blue (RGB) phosphors.

Advantages and Improvements of the First Embodiment

The composition and crystal structure of the phosphor of the present invention is significantly different and technically distinct from previously-reported yellow-emitting phosphors. Moreover, the phosphor of the first embodiment is expected to provide a good CRI, because it has an emission band centered in the wavelength region from 561 nm to 570 nm with a relatively broad FWHM value in comparison with the YAG:$Ce^{3+}$ phosphor. Furthermore, the color tunability of the phosphor with the change of lanthanide is a very attractive property for use with white light generation.

Technical Description of the Second Embodiment

The first embodiment of the present invention disclosed a new yellow-emitting phosphor, $La_{1-x}Ce_xSr_2AlO_5$, for white LED applications, wherein the first embodiment phosphor has a tetragonal structure with a space group I4/mcm (No. 140) with cell parameters a=6.8839(1) Å, and c=11.0420(2) Å.

$EuSr_2AlO_5$ was the first to be used in a compound with $La_{1-x}Ce_xSr_2AlO_5$, and a series of isotypic compounds with the general formula $Ba_3SiO_5$ (space group P4/ncc, No. 130) were first to be reported [3, 4]. Since then, $Sr_3SiO_5$ has been developed by Blasse et al. [5] as a phosphor material for $Eu^{2+}$ ions, before Park et al. [6], Kim et al. [7] and Fiedler et al. [8] reported LED applications.

Based on structural information, a second embodiment of the present invention has combined $LaSr_2AlO_5$ and $Sr_3SiO_5$ via a solid solution, and has been able to remarkably enhance the $LaSr_2AlO_5$ and $Sr_3SiO_5$ luminescent properties using the form of the solid solution. A solid solution can be defined as a solid-state solution of one or more solutes in a solvent. In the present invention, a $LaSr_2AlO_5$ phosphor plays the role of the solvent for the solute comprising a $Sr_3SiO_5$ phosphor. In this case, when the crystal structure of the solvent ($LaSr_2AlO_5$) remains unchanged by addition of the solutes ($Sr_3SiO_5$), and when the mixture of the solvent and solute remains in a single phase, the present invention considers such a mixture as a solid solution. Through the solid solution between the $Sr_3SiO_5$ and $LaSr_2AlO_5$, the present invention can expect excellent properties of the material by distorting the crystal lattice and disrupting the physical and electrical homogeneity of the $Sr_3SiO_5$ solvent material. Using the solid solution comprising $LaSr_2AlO_5$ and $Sr_3SiO_5$, the present invention is able to tune the excitation bands of $LaSr_2AlO_5$ and $Sr_3SiO_5$ from 420 to 450 nm depending on the amount of solid solution (i.e. depending on the relative amount of solute ($Sr_3SiO_5$) in the solid solution, represented by (y+w) in $La_{1-(y+w)-0.025}Ce_{0.025}Sr_{2+(y+w)}Al_{1-(y+w)}Si_{y+w}O_5$).

The present invention uses a blue (or long UV) LED combined with a yellow-emitting phosphor. To combine the blue (or long UV) LED with a yellow-emitting phosphor for white light generation, the yellow-emitting phosphor is coated on the blue LED, as disclosed in PCT Publication No. WO 98/05078 [9].

Process Steps of the Second Embodiment

Figure 7:
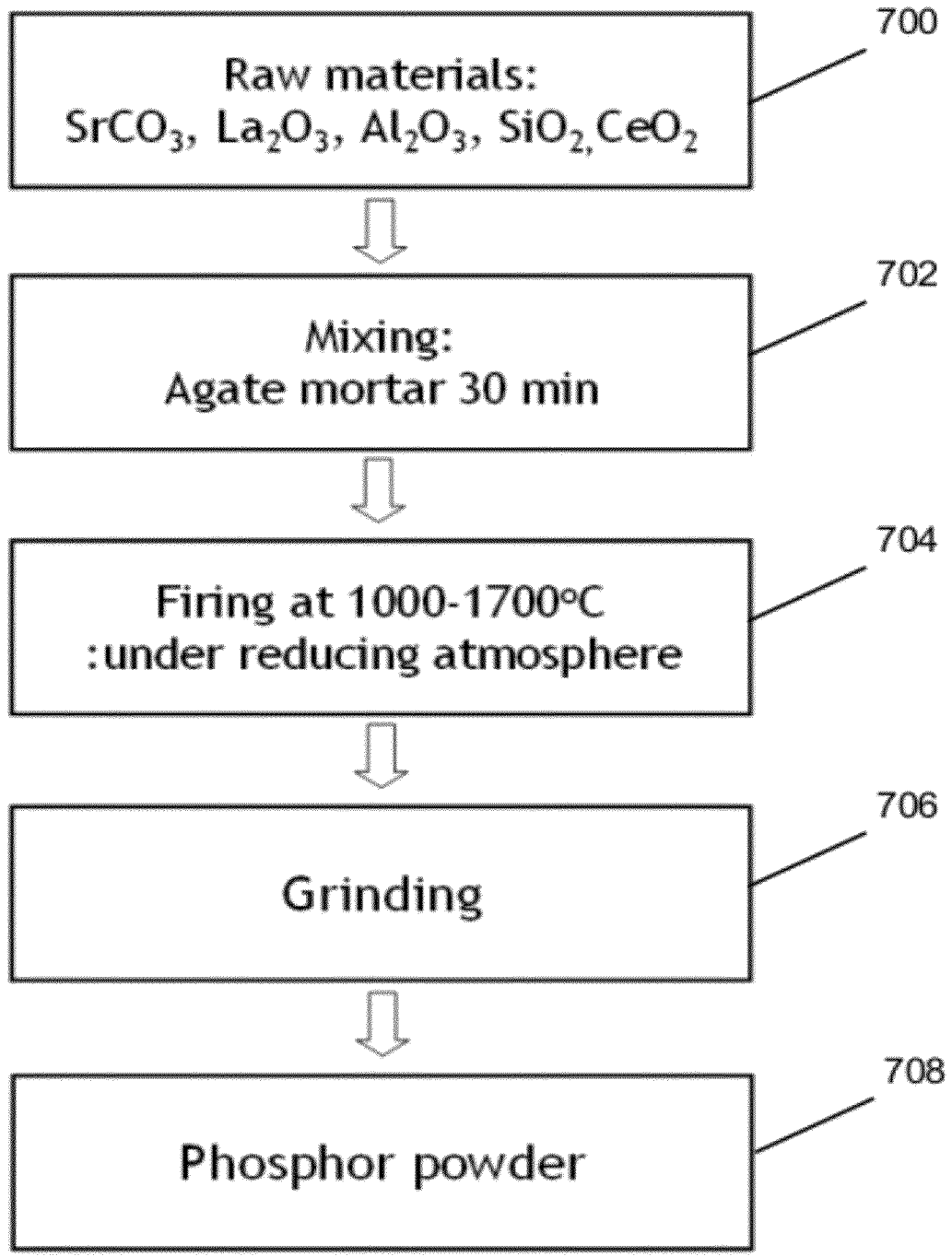
FIG. 7 is a flowchart illustrating an experimental procedure, a method for fabricating a phosphor composition according to the second embodiment of the present invention.

FIG. 7 shows an experimental procedure of the second embodiment of the present invention.

Block 700 represents selecting raw materials $SrCO_3$, $La_2O_3$, $Al_2O_3$, $SiO_2$, and $CeO_2$. In order to synthesize:

$$(La_{1-x-(y+w)-z}RE_z)(Sr_{1-u+(y+w)}A_u)_2(Al_{1-(y+w)-v}III_v Si_{y+w}IV_w)O_5:Ce^{3+}_x$$

phosphor samples, $CaCO_3$, $SrCO_3$, $BaCO_3$, $La_2O_3$, $Gd_2O_3$, $Tb_4O_7$, $Al_2O_3$, $SiO_2$, $GeO_2$, $SnO_2$, $H_3BO_3$, $Ga_2O_3$, $In_2O_3$, $Sc_2O_3$ and $CeO_2$ were used as raw materials in stoichiometric amounts. In particular, the following might be used: one or more carbonates or oxides of one or more alkaline earth metals (A), $Al_2O_3$, $SiO_2$, and $CeO_2$. In addition, one or more of the following flux materials could be added: $Li_2CO_3$, $SrF_2$, $BaF_2$, $NH_4Cl$, $NH_4F$, $H_3BO_3$, and $AlF_3$, in the range of 0.005 to 30 wt % for high crystallinity and efficient emission from the phosphor samples.

Block 702 represents mixing the raw materials using an agate mortar for 30 minutes to create a mixture.

Block 704 represents heating or firing the mixture at a temperature between 1000° C. and 1700° C. in a reduction atmosphere (under reducing atmosphere) to form a phosphor sample. The heating step may further comprise heating the mixture two or more times to achieve higher crystallinity for the sample, thereby enhancing one or more optical properties of the phosphor sample. The reduction atmosphere may be provided by supplying a gas mixture having both nitrogen and hydrogen, wherein the hydrogen is 2 to 25% by volume such that the hydrogen's volume in the gas mixture is 2-25% of the gas mixture's volume.

Block 706 represents grinding the phosphor sample.

Block 708 represents the end result of the process, namely the desired phosphor powder. Specifically, the phosphor powder comprises or is defined as:

$$(La_{1-x-(y+w)-z}RE_z)(Sr_{1-u+(y+w)}A_u)_2(Al_{1-(y+w)-v}III_v Si_{y+w}IV_w)O_5:Ce^{3+}_x$$

wherein $0<x \leq 0.3$; $0 \leq u \leq 1$; A includes at least one alkaline earth metal; $0 \leq z \leq 1$; RE includes at least one lanthanide; $0 \leq v \leq 1$; III includes at least one atom selected from Al, B, Ga, and In; $0 \leq w \leq 1$; IV includes at least one atom selected from Ge and Sn; and $0<y+w<1$. The phosphor composition may be obtained in a solid solution form. The solid solution combines attractive properties of two distinct systems, LaSr$_2$AlO$_5$ and Sr$_3$SiO$_5$, for example. LaSr$_2$AlO$_5$ has a superior CRI (e.g. CRI=R$_a$ of at least 85), and Sr$_3$SiO$_5$ has excellent absorption properties in the wavelength range 400 nm-450 nm but a lower R$_a$ (<65). An excitation and emission band of the phosphor composition can be tuned by varying y+w, x, or changing the La amount in the phosphor composition. Furthermore La may be replaced by RE in the solid solution such that RE is Gd or Tb. Or, x−(y+w)−z=1 and RE may be Gd or Tb, for example.

In a first variant of the second embodiment (y+w<0.5), the raw materials of the phosphor are SrCO$_3$, La$_2$O$_3$, Al$_2$O$_3$, SiO$_2$ and CeO$_2$. As described above, Sr, La, and Si can be replaced by various elements such as Ca, Ba, Tb, Gd, Ge, Sn, etc., if required. In this case, the synthesis conditions are the same as noted above.

Experimental Results of the Second Embodiment

Figure 8:
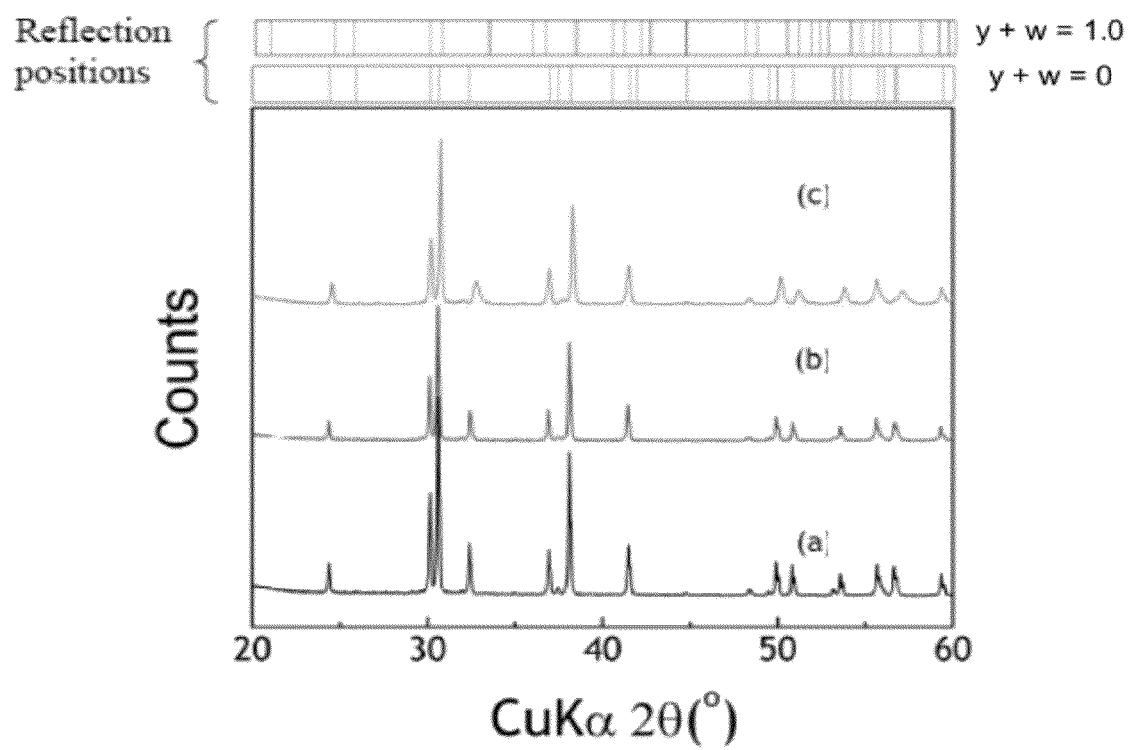

FIG. 8 shows XRD patterns of La$_{1−(y+w)−0.025}$Ce$_{0.025}$Sr$_{2+(y+w)}$Al$_{1−(y+w)}$Si$_{y+w}$O$_5$ depending on the amount of y+w (y+w=0, 0.2, and 0.4). Using the above-described experimental procedure, the single phases of La$_{1−(y+w)−0.025}$Ce$_{0.025}$Sr$_{2+(y+w)}$Al$_{1−(y+w)}$Si$_{y+w}$O$_5$ phosphor samples were obtained.

FIG. 9 shows the luminescent property of this first variant has a broad excitation band from 365 nm to 500 nm with a maximum from 410 nm to 450 nm depending on the amount of solid solution. In addition, the first variant has an emission band centered in the range from 544 to 560 nm with a relatively broad FWHM value in comparison with a YAG:Ce$^{3+}$ phosphor. FIG. 9 shows the phosphor composition may be

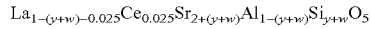

La$_{1−(y+w)−0.025}$Ce$_{0.025}$Sr$_{2+(y+w)}$Al$_{1−(y+w)}$Si$_{y+w}$O$_5$ with y+w<0.5 so that: the composition is excited by light having an excitation wavelength from 365 nm to 500 nm with a maximum from 410 to 450 nm; and the composition emits light having an emission wavelength centered in a range from 544 nm to 560 nm, with a FWHM value broader than a FWHM of a YAG:Ce$^{3+}$ phosphor.

In a second variant of the second embodiment (y+w>0.5), the raw materials of the phosphor are SrCO$_3$, La$_2$O$_3$, Al$_2$O$_3$, SiO$_2$ and CeO$_2$. As described above, Sr, La, and Si can be replaced by various elements such as Ca, Ba, Tb, Gd, Ge, Sn, etc., if required, and the synthesis conditions are the same as noted above.

FIG. 10 shows XRD patterns of La$_{1−(y+w)−0.025}$Ce$_{0.025}$Sr$_{2+(y+w)}$Al$_{1−(y+w)}$Si$_{y+w}$O$_5$ depending on the amount of y+w in the second variant (y+w=0.6, 0.8, and 1.0). Using the above described experimental procedure, the single phases of La$_{1−(y+w)−0.025}$Ce$_{0.025}$Sr$_{2+(y+w)}$Al$_{1−(y+w)}$Si$_{y+w}$O$_5$ phosphor samples were obtained.

The luminescent property of this second variant has a broad excitation band from 365 nm to 500 nm with a maximum from 410 nm to 420 nm depending on the solid solution amount as shown in FIG. 11. In addition, the second variant has an emission band centered in the range from 537 nm to 545 nm with a relatively broad FWHM value in comparison with a YAG:Ce$^{3+}$ phosphor. Thus, FIG. 11 shows the phosphor composition may be

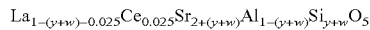

La$_{1−(y+w)−0.025}$Ce$_{0.025}$Sr$_{2+(y+w)}$Al$_{1−(y+w)}$Si$_{y+w}$O$_5$ with y+w>0.5 so that: the composition is excited by light having an excitation wavelength from 365 nm to 500 nm with a maximum from 410 nm to 420 nm and the composition emits light having an emission wavelength centered in the range from 537 nm to 545 nm, with a FWHM value broader than FWHM of a YAG:Ce$^{3+}$ phosphor.

The first and second variants show that, depending on the amount of y+w, the maximums of the excitation bands of the present invention may be gradually shifted from 450 nm to 420 nm. Therefore, the present invention can tune the LaSr$_2$AlO$_5$ and Sr$_3$SiO$_5$ excitation bands by combining the LaSr$_2$AlO$_5$ and Sr$_3$SiO$_5$ in solid solution form (i.e. the relative amount of (y+w) in La$_{1−(y+w)−0.025}$Ce$_{0.025}$Sr$_{2+(y+w)}$Al$_{1−(y+w)}$Si$_{y+w}$O$_5$).

In a third and fourth variant of the second embodiment, the raw materials of the phosphor are SrCO$_3$, Al$_2$O$_3$, SiO$_2$, CeO$_2$, and Gd$_2$O$_3$ (third variant) or Tb$_4$O$_7$ (fourth variant). The synthesis conditions are the same as noted above.

FIG. 12 illustrates that La may be replaced by RE in the solid solution and RE is Gd or Tb. FIG. 12 shows the luminescent properties of both the third and fourth variants (Gd ions or Tb ions, respectively) include a broad excitation band from 365 nm to 500 nm with a maximum at 405 nm and 430 nm, corresponding to the Tb and Gd ions, respectively (which ions are used instead of the La ion). The excitation peaks for the variants with the Tb and Gd ions were centered at 542 nm and 548 nm, respectively. This means that changing the lanthanide ions in the host lattice tunes the phosphor's dominant emission wavelength and excitation maximum with ease. Due to the one or more attractive properties of the present invention, the present invention can obtain a perfectly white light LED by combining a blue LED with the yellow-orange phosphors of the present invention.

Thus, FIGS. 9, 11, and 12 illustrate that one or more of x, y, w, and z in the phosphor of the second embodiment may be such that the phosphor emits yellow and/or orange light (e.g. one or more wavelengths between 537 nm and 560 nm) when excited by blue or UV light (for example, blue or UV light comprising a wavelength between 365 nm and 500 nm). FIGS. 9, 11, and 12 also illustrate that an excitation and emission band of the phosphor composition can be tuned by varying y+w, or changing the La amount in the phosphor composition.

Possible Modifications and Variations of the Second Embodiment

As noted above, in the present invention, a phosphor composition is made according to the following formula:

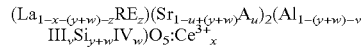

(La$_{1−x−(y+w)−z}$RE$_z$)(Sr$_{1−u+(y+w)}$A$_u$)$_2$(Al$_{1−(y+w)−v}$III$_v$Si$_{y+w}$IV$_w$)O$_5$:Ce$^{3+}_x$ wherein 0<x≦0.3, 0≦u≦1, A includes at least one element selected from the alkaline earth metals in the periodic table, for example, Mg, Ca and Ba, 0≦z≦1, RE includes at least one atom selected from the lanthanides in the periodic table, for example, Gd, Tb, and Y, 0≦v≦1, III includes at least one atom selected from Al, B, Ga, and In, 0≦w≦1, IV includes at least one atom selected from Ge and Sn, and 0≦y+w≦1. The present invention also discloses a preparation method for a white LED using the present phosphor.

In particular, efficiency of a phosphor may be enhanced by adding an additional (absorbing) ion to the host lattice, wherein the additional ion may absorb the exciting radiation and subsequently transfer it to the activator. In this case the absorbing ion is called a sensitizer. In this regard, a small amount of Pr, Nd, Sm, Eu, Dy, Ho, Er, Tm, Yb, Lu, Mn, Zn, and Bi can be added to the host lattice as a sensitizer. In addition, in the case of a divalent ion used as the sensitizer, the phosphor may comprise one or more ions chosen from the group formed by Li$^+$, Na$^+$, and K$^+$, for charge compensation.

It is possible to use various methods for the synthetic method of the present invention: spray pyrolysis, co-precipitation, sol-gel method, solvothermal, hydrothermal method, etc. In order to enhance the phosphor's one or more optical properties, it is possible to heat the raw materials mixture two or more times, in order to achieve high crystallinity of the resulting phosphor sample.

The present invention may provide new yellow-emitting phosphor powders and white light emitting LEDs which include the phosphor. White LED generation may be achieved by using the present invention with various combinations, for example, with a blue LED and a yellow-emitting phosphor, a blue LED and green-orange phosphors, or a blue LED and yellow-red phosphors depending upon various color gamut needs. A good color rendering property from the combination of the LED and the phosphor can be obtained due to the phosphor's broad emission with a wide spectral range.

The phosphor composition

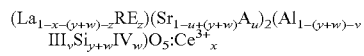

can have x, y, w, and z such that the phosphor composition is used for white light applications in combination with one or more red, green, and blue (RGB) phosphors.

The phosphor may be applied to, or combined with, an InGaN based blue LED or a GaN-based UV LED with a chip packaging process, for example. The luminescent properties of the LED may be modified by various mixing ratios of epoxy resin and phosphor powder. The composition of the phosphor may be modified to achieve different optical properties.

It is possible to use lanthanide carbonate to synthesize the present invention, but lanthanide oxide is usually used.

Advantages and Improvements of the Second Embodiment

In order to generate white light from LEDs, there are basically two strategies: the first approach is to mix different red, green, and blue components from LED chips, and the second approach is to down-convert the emission from a blue LED or UV LED to a longer wavelength using a phosphor. In terms of cost, efficiency, and simple fabrication, the second method has been widely used for fabrication of a white LED by coating a yellow-emitting phosphor on a blue LED, and is disclosed in PCT Patent Publication No. WO 1998/005078 [9].

However, because the YAG:Ce$^{3+}$ phosphor has a relatively weak light emitting intensity in the red spectral region, it is difficult to obtain a good CRI. Furthermore, in order to use the yellow-emitting phosphor in a display device, such as in a backlight unit for an LCD, it is also important to obtain a suitable color temperature using the yellow-emitting phosphor. Therefore, many groups have intensively studied the field of yellow-emitting phosphors.

One of the end members $M_3SiO_5$ (M=Ca, Sr, Ba) was developed by Blasse et al. [5] as a phosphor material for Eu$^{2+}$ ions, and then Park et al. [6], Kim et al. [7], and Fiedler et al. [8] reported the LED application for the phosphor material. Therefore, the present invention does not cover the end member $Sr_3SiO_5$ corresponding to y+w=1.0 in the formula $La_{1-(y+w)-0.025}Ce_{0.025}Sr_{2+(y+w)}Al_{1-(y+w)}Si_{y+w}O_5$.

The phosphor composition and crystal structure of the first embodiment, namely:

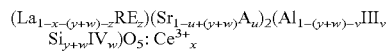

is different from compositions or crystal structures found in the prior art. In particular, the new yellow-emitting phosphor of the first embodiment, $La_{1-x}Ce_xSr_2AlO_5$, which is one of the end members of the second embodiment, can be used for white-LED applications.

The second embodiment is also technically distinct from the reported yellow-emitting phosphors in terms of composition. In addition, the phosphor of the second embodiment is also expected to have a good CRI, because the phosphor of the second embodiment has an emission band centered in the wavelength region from 535 nm to 560 nm with a relatively broad FWHM value in comparison with YAG:Ce$^{3+}$ phosphor. Furthermore, the second embodiment discloses the tunability of color and excitation band with a change of host elements and an amount of solid solution, to achieve very attractive properties for perfect white light generation and good color rendering.

Crystal Structure

FIG. 13(a) is a schematic of the crystal structure/host lattice 1300 of the first embodiment, a Ce$^{3+}$-based aluminate phosphor, comprising $La_{1-x}Sr_2AlO_5$:Ce$^{3+}_x$, showing positions of the La or Sr$_1$ atoms 1302, Sr atoms 1304 constituting Sr$_2$ 1306, Aluminum (Al) atoms 1308, and Oxygen (O) atoms 1310, wherein La 1302 are substituted with Ce$^{3+}$ ions in the proportion of 0<x≦0.3 to obtain Ce$^{3+}$ doping. (Half the 8h site is filled by La atoms, and half is filled by Sr atoms (Sr$_1$), i.e., both La and Sr$_1$ atoms are distributed statistically on 8h site equally.) In a variant of the first embodiment, $(Sr_{1-y}A_y)_2(La_{1-x-z}R_z)(Al_{1-u}III_u)O_5$: Ce$^{3+}_x$, A includes at least one element selected from alkaline earth metals in the periodic table, R includes at least one element selected from lanthanide in the periodic table, and III includes at least one element selected from Al, B, Ga, and In. In this case, Sr 1304 (or 1302) may be substituted with A, La 1302 may be substituted with R, Al 1310 may be substituted with III, in proportions 0≦y≦1, 0≦z≦1, 0≦u≦1 respectively. FIG. 13(a) also shows the phosphor typically has a tetragonal space group I4/mcm (No. 140) with lattice parameters a≈b≈6.88 Å and c≈11.04 Å.

FIG. 13(b) illustrates the 8 coordination of Oxygen 1310 around the La$^{3+}$/Ce$^{3+}$ 1302.

FIG. 14 is a schematic of the crystal structure/host lattice 1400 of LaSr$_2$AlO$_5$, showing positions of the La or Sr$_1$ 1402 atoms, Sr 1404 atoms constituting Sr$_2$, Al atoms 1406 and O atoms 1408 constituting AlO$_4$ 1410, and the crystal structure/host lattice 1412 of Sr$_3$SiO$_5$, showing positions of Sr atoms 1414, and Si atoms 1416 and O atoms 1418 constituting SiO$_4$ 1420. (Half the 8h site is filled by La atoms, and half is filled by Sr atoms (Sr$_1$), i.e., both La and Sr$_1$ atoms share the 8h site equally.)

The second embodiment of the present invention comprises the crystal structure 1400 of LaSr$_2$AlO$_5$ and the crystal structure 1412 of Sr$_3$SiO$_5$, for example, forming:

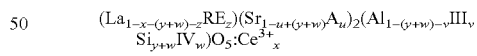

wherein A includes at least one alkaline earth metal; RE includes at least one lanthanide; III includes at least one atom selected from Al, B, Ga, and In; IV includes at least one atom selected from Ge and Sn; and 0<y+w<1. Furthermore La 1402 may be substituted with Ce$^{3+}_x$, Sr 1402 and 1414 may be substituted with A, La 1402 may be substituted with RE, Al 1406 may be substituted with III, and Si 1416 may be substituted with IV, in proportions 0<x≦0.3; 0≦u≦1; 0≦z≦1; 0≦v≦1 and 0≦w≦1, respectively.

FIG. 14 illustrates that the phosphor composition of the second embodiment may be in a solid solution form. The present invention combines the attractive properties of two distinct systems, LaSr$_2$AlO$_5$ and Sr$_3$SiO$_5$ in a solid solution. LaSr$_2$AlO$_5$ has superior CRI (e.g. R$_a$ of at least 85), and Sr$_3$SiO$_5$ has excellent absorption properties in the wavelength range 400 nm-450 nm but a lower R$_a$ (<65).

The host lattice for the activator should provide a crystal field splitting around the activator ion (the $Ce^{3+}$) sufficiently strong to enable longer wavelength (yellow) emission (see FIG. 15). The strong crystal field is enhanced by the short between distance between the $Ce^{3+}$ ion 1302 and O ligand ions 1310, and the smaller ionic radius of 8 co-ordinate $Ce^{3+}$ as compared to $La^{3+}$. The crystal field splitting is sufficiently large to cause the larger FWHM and larger CRI as compared to YAG: $Ce^{3+}$.

The mean Ce—O distance can be a proper measure of the volume of $CeO_8$ polyhedra and the magnitude of relevant crystal field splitting. Based on the point charge model the d-orbital splitting of a metal center is given as:

$$\Delta = Dq = \frac{Ze^2 r^4}{6R^5} \infty \frac{1}{R^5}$$

wherein:

Dq corresponds to the energy level separation,

Z is the valence of the anion ligand, e is electron charge, r is the radius of frontier d wavefunction, and R is the distance between metal center and ligand.

As the relation $Dq \approx R^{-5}$ goes, even a small change in the mean Ce—O distance will significantly alter the observed emission energies. Other factors being equal, when the metal-ligand distance decreases, the repulsive electrostatic interaction increases, and so does crystal field splitting. As a net effect, the lowest-lying Ce 5d-level moves downward in energy, resulting in the red shift of emission wavelengths. The substitutions of Ce for La result in the contraction of Ce—O bonds, which is in turn expected to decrease the emission band energy.

In the present invention, $LaSr_2AlO_5$ phosphor plays a role of solvent for solute of $Sr_3SiO_5$ phosphor. In that case, the crystal structure of the solvent ($LaSr_2AlO_5$) remains unchanged by addition of the solutes ($Sr_3SiO_5$). Thus, each crystal structures such as $LaSr_2AlO_5$, $Sr_3SiO_5$ show a solid solution structure depending on the change of space group.

Optical Properties and White LED Application

FIG. 16(a) illustrates that the first embodiment may have one or more of x, y, z, and u so that the first embodiment is a yellow-emitting phosphor emitting yellow light, a green-or-ange phosphor emitting light in the green to orange spectral range, or a yellow-red phosphor emitting light in the yellow to red spectral range. For example, FIG. 16(a) illustrates that x, y, z, and u may be such that the phosphor emits light having a wavelength from 470 nm to 760 nm when excited by blue or ultraviolet light.

FIG. 16(b) illustrates that as the amount of $Ce^{3+}$ in the phosphor of the first embodiment is increased, the wavelength of light emitted by the phosphor also increases. However, if the concentration is $Ce^{3+}$ is too high, concentration quenching may occur, decreasing the intensity of emitted light (FIG. 16(c)). Typically, the amount of $Ce^{3+}$ is such that x is 0.025 or less in $La_{1-x}Ce_xSr_2AlO_5$, to prevent concentration quenching.

FIGS. 16(b)-(c) illustrate that an excitation and emission band of the phosphor composition can be tuned by varying x to change the La amount in the phosphor composition.

FIGS. 17(a)-(c) illustrate the luminescence intensity emitted by a white LED comprising an InGaN LED with a phosphor according to a variant of the first embodiment wherein in (a), the phosphor is $La_{1-x}Ce^{3+}_xSr_2AlO_5$, in (b) the phosphor is:

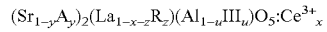

with A=Ba and y=0.5, and in (c) the phosphor is $(Sr_{1-y}A_y)_2$ $(La_{1-x-z}R_z)(Al_{1-u}III_u)O_5$: $Ce^{3+}_x$ with R=Gd and R=Tb and z=1.

FIG. 18(a) also illustrates the luminescence intensity emitted by a white LED comprising an InGaN LED with a phosphor according to the second embodiment comprising $La_{1-x}Ce^{3+}_xSr_2AlO_5$, and FIG. 18(b) illustrates the effect of the drive current or forward bias current (EL) on the CIE color co-ordinates.

FIGS. 19(a)-(b) illustrate the luminescence intensity emitted by a white LED comprising an InGaN LED with a phosphor according to a variant of the second embodiment comprising $La_{1-x-0.025}Ce_{0.025}Sr_{2+x}A_{1-x}Si_xO_5$, wherein x=y+w.

TABLE 1

CRI for the first embodiment for the phosphor samples of FIG. 17(a), FIG. 17(b) and FIG. 17(c).

| Sample | $R_a$ |
|---|---|
| (a) | 80~82 |
| (b) | 78~80 |
| (c) | 81~85 |

TABLE 2

Yellow Phosphors for potential use in white LEDs

| Composition | Property |
|---|---|
| $Y_3Al_5O_{12}$:$Ce^{3+}$ | Low $R_a$ (<75), thermal quenching |
| $Sr_2SiO_4$:$Eu^{2+}$ | Moisture unstable |
| $Sr_3SiO_5$:$Eu^{2+}$ | Low $R_a$ (<65) |
| Ca-α-SiAlON:$Eu^{2+}$ | Low $R_a$ (<65) |
| $CaSi_2O_2N_2$:$Eu^{2+}$ | Need for special synthetic methods |
| $Li_2SrSiO_4$:$Eu^{2+}$ | Low $R_a$ (<65) |
| Ca(Al,Si)$N_2$:$Ce^{3+}$ | Need for special synthetic methods |

The phosphors of the present invention have high efficiency, high $R_a$ (see Table 1), ease of manufacture and low cost, and good thermal stability as compared to other phosphors (see Table 2). FIGS. 16(a)-(c), 17(a)-(c), 18(a)-(b), and 19(a)-(c) show that one or more of x, y, z, u, w in the phosphors of the present invention (as well as bias current through the LED) can be selected to obtain a high $R_a$ (e.g. above 75) and/or a suitable color temperature.

REFERENCES

The following references are incorporated by reference herein:

[1] J. K. Park, M. A. Kim, C. H. Kim, H. D. Park, J. T. Park, and S. Y. Choi, Appl. Phys. Lett., 82 (2003) 683-685.

[2] R. J. Xie, N. Hirosaki, K. Sakuma, Y. Yamamoto, and M. Mitomo, Appl. Phys. Lett. 84 (2004) 5404-5406.

[3] M. Drofenik and L. Golic, *Acta Cryst.*, B35 (1979) 1059.

[4] L. S. Dent Glasser and F. P. Glasser, *Acta Cryst.*, 18, (1965) 453.

[5] G. Blasse, W. L. Wanmaker, J. W. ter Vrugt, and A. Bril, *Philps. Res. Repts.*, 23 (1968) 189.

[6] J. K. Park, K. J. Choi, K. N. Kim, and C. H. Kim, *Appl. Phys. Lett.*, 87 (2005) 031108.

[7] U.S. Pat. No. 7,045,826 by Chang Hae Kim et al., entitled "Strontium silicate-based phosphor, fabrication method thereof, and LED using the phosphor," issued May 16, 2006.

[8] PCT Patent Publication No. WO/2006/081803, published Oct. 8, 2006, by Fiedler et al., and entitled "Illuminant emitting yellow light and light source provided with such an illuminant," and corresponding to PCT Patent Application Serial No. PCT/DE2006/000160, filed Feb. 2, 2006.

[9] PCT Patent Publication No. WO/1998/005078, published Feb. 5, 1998, by Shimizu et al., entitled "Light Emitting Device and Display Device," and corresponding to PCT Patent Application Serial No. PCT/JP1997/002610, filed Jul. 29, 1997.

[10] J. K. Park, K. J. Choi, J. H. Yeon, S. J. Lee, and C. H. Kim, *Appl. Phys. Lett.*, 88 (2006) 043511.

[11] Won Bin Im, Young-Il Kim, Natalie N. Fellows, Hisashi Masui, G. A. Hirata, Steven P. DenBaars and Ram Seshadri, entitled "A New Yellow-Emitting $Ce^{3+}$ Phosphor, $La_{1-x}Ce_xSr_2AlO_5$, for White Light-Emitting Diodes," Applied Physics Letters 93, 091905 (2008).

[12] Greenham et al., Chem. Phys. Lett., 241, (1995) 89.

[13] W. B. Im, N. N. Fellows, S. P. DenBaars, and R. Seshadri, "$La_{1-x-0.025}Ce_{0.025}Sr_{2+x}Al_{1-x}Si_xO_5$ solid solutions as tunable yellow phosphors for solid state white lighting", *J. Mater. Chem.* 19, 1325-1330 (2009).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching without fundamentally deviating from the essence of the present invention. It is intended that the scope of the invention be limited not by this detailed description, but rather by the claims appended hereto.

What is claimed is:

1. A $Ce^{3+}$-based aluminate phosphor, comprising:

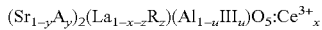

wherein $0<x\leq0.3$, A includes at least one element selected from alkaline earth metals in the periodic table, $0\leq y\leq1$, R includes at least one element selected from lanthanide in the periodic table, $0\leq z\leq1$, and III includes at least one element selected from Al, B, Ga, and In, and $0\leq u\leq1$.

2. The phosphor of claim 1, wherein x, y, z, and u are such that the phosphor emits light having a wavelength from 470 nm to 760 nm when excited by blue or ultraviolet light.

3. The phosphor of claim 1, wherein the phosphor includes an absorbing ion as a sensitizer that absorbs exciting radiation and transfers it to an activator in the phosphor that emits light having a wavelength longer than a wavelength of the exciting radiation.

4. The phosphor of claim 1, wherein the phosphor has a tetragonal space group I4/mcm (No. 140) with lattice parameters a≈b≈6.88 Å and c≈11.04 Å.

5. A White Light Emitting Diode, comprising:

(a) a light emitting diode (LED); and (b) a $Ce^{3+}$-based aluminate phosphor, optically coupled to the LED, wherein the $Ce^{3+}$-based aluminate phosphor comprises:

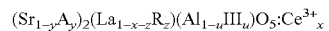

$0<x\leq0.3$, A includes at least one element selected from alkaline earth metals in the periodic table, $0\leq y\leq1$, R includes at least one element selected from lanthanide in the periodic table, $0\leq z\leq1$, and III includes at least one element selected from Al, B, Ga, and In, and $0\leq u\leq1$; and (c) at least one of a red, green, or blue phosphor in combination with the $Ce^{3+}$-based aluminate phosphor, (d) wherein the x, y, z, and u are variables selected such that the combination of the at least one of the red, green, or blue phosphor, the LED, and the $Ce^{3+}$-based aluminate phosphor, emits white light.

6. An apparatus for solid state lighting applications, comprising:

a light emitting diode (LED); and a $Ce^{3+}$-based aluminate phosphor, positioned adjacent the LED, that emits light when excited by radiation from the LED, the yellow emitting $Ce^{3+}$-based aluminate phosphor being defined as:

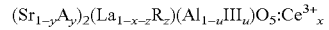

wherein $0<x\leq0.3$, A includes at least one element selected from alkaline earth metals in the periodic table, $0\leq y\leq1$, R includes at least one element selected from lanthanide in the periodic table, $0\leq z\leq1$, and III includes at least one element selected from Al, B, Ga, and $0\leq u\leq1$.

7. A method for creating a $Ce^{3+}$-based aluminate phosphor defined as:

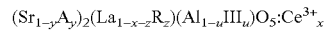

wherein $0<x\leq0.3$, $0\leq y\leq1$, A includes at least one element selected from alkaline earth metals in the periodic table, $0\leq z\leq1$, R includes at least one element selected from lanthanide in the periodic table, $0\leq u\leq1$, and III includes at least one element selected from Al, B, Ga, and In, the method comprising the steps of:

mixing stoichiometric amounts of carbonate or oxide of alkaline earth metals (M), alumina ($Al_2O_3$) and cerium oxide ($CeO_2$) to create a mixture; and heating the mixture to create the $Ce^{3+}$-based aluminate phosphor.

8. The method of claim 7, further comprising adding flux materials to the mixture.

9. The method of claim 7, wherein the heating step comprises heating the mixture to a temperature between 1000° C. and 1600° C.

10. The method of claim 7, wherein the heating step comprises heating the mixture in a reduction atmosphere.

11. A phosphor composition, comprising:

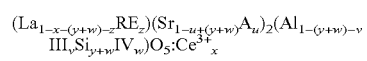

wherein:
0<x≦0.3;
0≦u≦1;
A includes at least one alkaline earth metal;
0≦z≦1;
RE includes at least one lanthanide;
0≦v≦1;
III includes at least one atom selected from Al, B, Ga, and In;
0≦w≦1;
IV includes at least one atom selected from Ge and Sn; and
0<y+w<1.

12. The phosphor composition of claim 11, wherein x, y, w, and z are such that the phosphor emits yellow light or orange light, or yellow light and orange light, when excited by blue or ultraviolet light.

13. The phosphor composition of claim 12, wherein the phosphor composition is in a solid solution form.

14. The phosphor composition of claim 13, wherein La is replaced by RE in the solid solution and RE is Gd or Tb.

15. The phosphor composition of claim 12, wherein x−(y+w)−z=1 and RE is Gd or Tb.

16. The phosphor composition of claim 12, wherein the phosphor composition is:

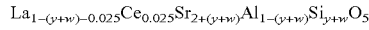

with y+w<0.5, so that:
the composition is excited by light having an excitation wavelength from 365 nm to 500 nm with a maximum from 410 to 450 nm; and
the composition emits light having an emission wavelength centered in a range from 544 nm to 560 nm.

17. The phosphor composition of claim 12, wherein the phosphor composition is:

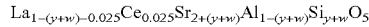

with y+w>0.5 so that:
the phosphor composition is excited by light having an excitation wavelength from 365 nm to 500 nm with a maximum from 410 nm to 420 nm; and
the phosphor composition emits light having an emission wavelength centered in the range from 537 nm to 545 nm.

18. The phosphor composition of claim 12, wherein an excitation and emission band of the phosphor composition is tuned by varying y+w, or changing the La amount in the phosphor composition.

19. A White Light Emitting Diode, comprising:
(a) a light emitting diode (LED); and
(b) a phosphor composition optically coupled to the LED, comprising:

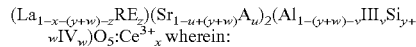 wherein:

0<x≦0.3;
0≦u≦1;
A includes at least one alkaline earth metal;
0≦z≦1;
RE includes at least one lanthanide;
0≦v≦1;
III includes at least one atom selected from Al, B, Ga, and In;
0≦w≦1;
IV includes at least one atom selected from Ge and Sn; and
0<y+w<1; and
(c) at least one of a red, green, or blue phosphor in combination with the phosphor composition,
(d) wherein the x, y, w, and z are variables selected such that the combination of the at least one red, green, or blue phosphor, the LED, and the phosphor composition, emits white light.

20. A blue or ultraviolet light emitting diode (LED) optically coupled to the phosphor composition of claim 12.

21. A method for fabricating a phosphor composition, defined as:

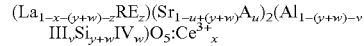

wherein 0<x≦0.3; 0≦u≦1; A includes at least one alkaline earth metal; 0≦z≦1; RE includes at least one lanthanide; 0≦v≦1; III includes at least one atom selected from Al, B, Ga, and In; 0≦w≦1; IV includes at least one atom selected from Ge and Sn; and 0<y+w<1, the method comprising the steps of:
mixing SrCO₃, La₂O₃, Al₂O₃, SiO₂, and CeO₂ in stoichiometric amounts to form a mixture; and
heating the mixture between 1000 and 1700° C. in a reduction atmosphere to form the phosphor composition.

22. The method of claim 21, wherein the mixing step further comprises adding one or more of flux materials comprising of Li₂CO₃, SrF₂, BaF₂, NH₄Cl, NH₄F, H₃BO₃, and AlF₃, in a range of 0.005 to 30 weight percentage for higher crystallinity and for more efficient emission of the phosphor composition.

23. The method of claim 22, wherein the mixing step is performed using an agate mortar for approximately 30 minutes.

24. The method of claim 21, wherein the heating step comprises heating the mixture two or more times to achieve higher crystallinity for the phosphor composition, thereby enhancing one or more optical properties of the phosphor composition.

25. The method of claim 21, wherein the reduction atmosphere is provided by supplying a gas mixture having both nitrogen and hydrogen, and the hydrogen is 2 to 25% by volume such that the hydrogen's volume in the gas mixture is 2-25% of the gas mixture's volume.

* * * * *